United States Patent
Augustine et al.

(10) Patent No.: US 12,007,826 B2
(45) Date of Patent: Jun. 11, 2024

(54) UNIFIED RETENTION AND WAKE-UP CLAMP APPARATUS AND METHOD

(71) Applicant: Intel Corporation, Santa Clara, CA (US)

(72) Inventors: Charles Augustine, Portland, OR (US); Pascal Meinerzhagen, Hillsboro, OR (US); Suyoung Bang, Hillsboro, OR (US); Abdullah Afzal, Austin, TX (US); Karthik Subramanian, Austin, TX (US); Muhammad Khellah, Tigard, OR (US); Arvind Raman, Austin, TX (US)

(73) Assignee: Intel Corporation, Santa Clara, CA (US)

( * ) Notice: Subject to any disclaimer, the term of this patent is extended or adjusted under 35 U.S.C. 154(b) by 636 days.

(21) Appl. No.: 17/128,076

(22) Filed: Dec. 19, 2020

(65) Prior Publication Data

US 2022/0091652 A1     Mar. 24, 2022

Related U.S. Application Data

(60) Provisional application No. 63/081,228, filed on Sep. 21, 2020.

(51) Int. Cl.
| | | |
|---|---|---|
| *G06F 1/32* | (2019.01) | |
| *G06F 1/08* | (2006.01) | |
| *G06F 1/10* | (2006.01) | |
| *G06F 1/12* | (2006.01) | |
| *G06F 1/324* | (2019.01) | |
| *G06F 1/3296* | (2019.01) | |
| *H03K 19/0175* | (2006.01) | |

(52) U.S. Cl.
CPC ............... *G06F 1/324* (2013.01); *G06F 1/08* (2013.01); *G06F 1/12* (2013.01); *G06F 1/3296* (2013.01); *H03K 19/017509* (2013.01)

(58) Field of Classification Search
CPC .......... G06F 1/324; G06F 1/3296; G06F 1/08; G06F 1/10; G06F 1/12
See application file for complete search history.

(56) References Cited

U.S. PATENT DOCUMENTS

| | | | | |
|---|---|---|---|---|
| 2014/0361828 | A1* | 12/2014 | Lundberg | H03K 19/0008 327/543 |
| 2018/0278246 | A1* | 9/2018 | Kilada | G06F 1/3287 |
| 2019/0243440 | A1 | 8/2019 | Meinerzhagen et al. | |
| 2020/0081512 | A1 | 3/2020 | Augustine et al. | |

FOREIGN PATENT DOCUMENTS

JP     2018019152 A  *  2/2018  ........... G06F 1/3206

* cited by examiner

*Primary Examiner* — Stefan Stoynov
(74) *Attorney, Agent, or Firm* — NICHOLSON DE VOS WEBSTER & ELLIOTT LLP

(57) ABSTRACT

Described is a controller that provides in-situ state retention using a closed loop global retention clamp. The controller addresses di/dt and reliability constraints using an adaptive scheme where steps with smaller current are quickly changed whereas steps with larger current are changed slowly. The loop controller of a voltage regulator is modified for controlling not only retention Vmin during a low power state (e.g., C1LP), but also to control fast wake up the low power state (e.g., from C1LP and from C6).

19 Claims, 16 Drawing Sheets

UNIFIED RETENTION AND WAKE-UP CLAMP APPARATUS AND METHOD

CLAIM OF PRIORITY

This application claims priority of U.S. Provisional Application with Ser. No. 63/081,228 titled "Unified Retention and Wake-Up Clamp Apparatus and Method," filed Sep. 21, 2020, which is incorporated by reference in its entirety.

BACKGROUND

Modern processing cores or processors have multiple power states to lower their power consumption when they are idle or stalled (e.g., low power state). The Advanced Configuration and Power Interface (ACPI) provides a standard for software (e.g., operating systems) to perform power management. Processor power states in the ACPI are defined as C-states, and include C0, C1, C2, C3, and onwards. C0 is the operating state or active state of a processor or processor core. C1 is a first level low power state of a processor or processor core and is also known as the Halt state. In C1 state, a processor or processor core is not executing instructions, but is expected to return to an executing state essentially instantaneously. In one example, in the low-power state C1, the processor core clock is gated to save dynamic capacitance, Cdyn. The C1 power state has very short entry ($T_{entry}$) and exit-time (or $T_{exit}$) as well as small break-even time (BET), defined as minimum time needed to stay in the C1 state to start saving power to amortize the energy spent entering and exiting the state. The small BET of the C1 state is due to the low energy overhead of entering into the state—paying only for the clock gating/un-gating Cdyn cost. However, C1 state may not allow for leakage power savings—making it best choice for short stall periods. On the other hand, ultra-low power saving state, such as the C6 state, virtually eliminates leakage power in addition to clock Cdyn. However, the C6 state comes at a higher $T_{entry}$ and $T_{exit}$, due to the time needed to copy and restore the processor core state, receptively, as well as higher BET due to energy overhead of entering and leaving the power state. This makes C6 state the better choice for very long idle periods to amortize its large energy overhead.

When exiting a low power state (e.g., C1LP state), gated supply voltage is increased from retention Vmin to active Vmin Here, Vmin, refers to minimum operating voltage below which a logic or processor does not function properly. During this event, the charging current can suddenly increase resulting in di/dt and reliability constraints. Similarly, while exiting another low-power state (e.g., C6), where gated supply rail voltage is increased from low voltage (e.g., ~0 V) to active Vmin, di/dt and reliability constraints are present.

It is a challenge for existing power supply generators and/or regulators to provide stable and fast power adjustment to the power supply output while ensuring stable operation across a very wide leakage load current range and when input power supply changes during transitions between various power states etc.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
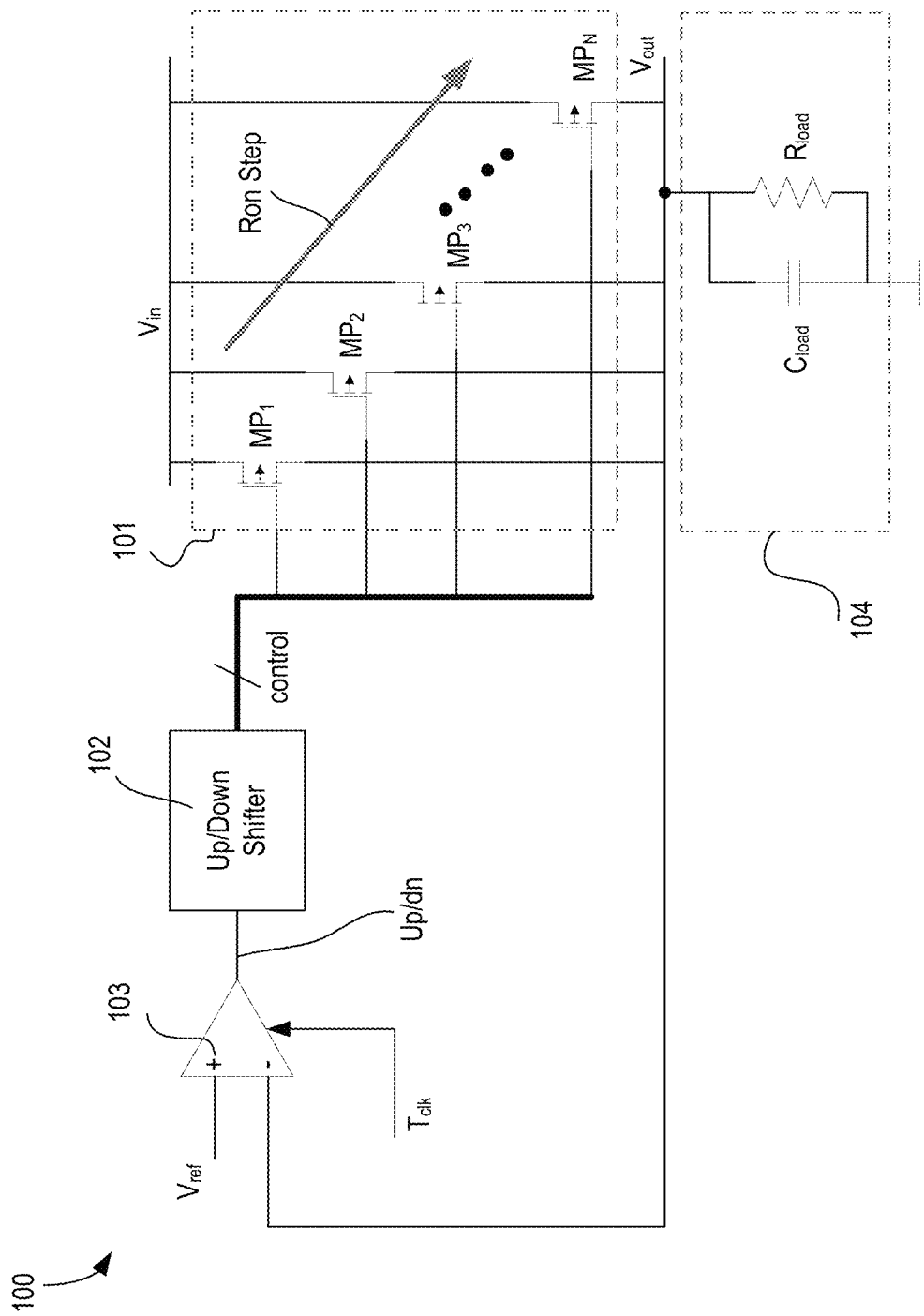
FIG. 1 illustrates a mixed signal low dropout (LDO) regulator.

Existing solutions to address di/dt and reliability constraints progressively turn ON secondary power gates at a fixed rate, say in 16 steps. However, current is not uniform during every step and hence the step with the largest current limits the rate of turn ON.

For intermediate idle periods, some embodiments use a new power state, called C1LP state, with much faster power state exit time $T_{exit}$ than the C6 power state and much better power savings compared to the C1 power state. C1LP leverages existing power gates (PGs) used to put a given processor core in C6 state along with the resistive ladder, or R-Ladder, based digital-to-analog converter (DAC) circuit for fast and reliable wake up. When exiting the C6 state, the R-ladder analog output voltage, which is connected to the gate node of some primary PGs (PPGs), is ramped down gradually every $T_{R\text{-}LADDER}$ step, thus ensuring smooth transition of the gated core voltage rail ($V_{OUT}$) from approximately 0 to $V_{IN}$. R-ladder enables fast yet reliable wake up by meeting reliability constraints of the PGs, while simultaneously limiting the voltage droop seen by an active core in this shared rail design.

An open-loop retention clamp can be enabled by simply applying a fixed post-silicon-tuned digital code to the R-ladder of a C1LP core to retain its memory element (e.g., (flip-flops and/or static random-access memory (SRAM)) near their $V_{RETENTION}$. However, this digital code needs to margin for worst case Process, Voltage (Vin), and Temperature (PVT) condition as they impact both the OFF (leakage) current of the core as well as the ON current from the PPGs during retention. Note, that the R-ladder DAC circuit itself, being a resistive divider, is resilient to a first order to process and temperature variations, but not Vin variations which can happen due to Dynamic Voltage and Frequency Scaling (DVFS) events. For example, measured open loop R-ladder clamp for a 0.5 V, 0.6 V, or 0.68 V target $V_{RETENTION}$ shows a wide required R-ladder code range of 12-14, 12-15, or 13-16 across PVT, respectively, motivating the need for a closed loop solution to tighten this range and maximizing the power benefit of C1LP.

Some embodiments describe an all-digital closed-loop retention clamp that comprises (beside existing R-ladder and PGs): (1) a ring-oscillator (RO) voltage sensor, and (2) bang-bang controller enhanced with voltage slope information. The bang-bang controller samples (every $T_{R\text{-}LADDER}$ step) the beat frequency BF(t) of the RO sensor at a given time (t) during retention. The controller then compares current BF(t) to a reference beat frequency (RBF), where RFB is found once post-silicon by running the RO sensor at the core $V_{RETENTION}$. The loop integrator is incremented, decremented, or remains unchanged as follows based on 1) the current error defined as e(t)=BF(t)−RBF, and 2) slope of the output voltage $V_{OUT}$ defined as BF(t)−BF(t−i), where i≥1. The integrator is incremented (or decremented) when $V_{OUT}$ is smaller (or larger) than $V_{RETENTION}$ while at the same time $V_{OUT}$ has a slope less (or greater) than a threshold value, RSLP. Otherwise, the loop integrator value is kept unchanged.

The control scheme of various embodiments allows the loop integrator to adapt its accumulation at a rate close to the output pole (which is a function of the load current at a given point in time) to avoid instability. In some embodiments, $T_{R\text{-}LADDER}$ can be set (to a first order) independent of 1) load current variation due to process and temperature (PT) and aging, 2) decoupling capacitor, and 3) $V_{IN}$. In some embodiments, $T_{R\text{-}LADDER}$ can be set slightly greater than the lowest possible delay, $T_{PATH}$, representing latency from controller to PGs, while the controller automatically allows the loop integrator to adapt its accumulation at a rate close to the current output pole to avoid instability.

The apparatus of some embodiments uses a leakage power reduction feature and in-situ state retention using a closed loop global retention clamp. Some embodiments address di/dt and reliability constraints using an adaptive scheme where steps with smaller current are quickly changed whereas steps with larger current are changed slowly. In some embodiments, a closed loop controller of a voltage regulator is modified for controlling not only retention Vmin during a low power state (e.g., C1LP), but also to control fast wake up from the low power state (e.g., from C1LP and from C6). The design of the closed loop controller reduces area, power, and design overhead versus if three separate controllers are used otherwise that apply progressively turn ON secondary power gates. In various embodiments, an apparatus is provided that uses a digital voltage sensor, proportional-difference controller, digitally controlled analog voltage generator, and power gates to enable retention control and fast wake-up.

In some embodiments, an apparatus comprises a plurality of power gates coupled to an input power supply rail and an output power supply rail, and a shifter to generate a control word to control the plurality of power gates. The apparatus comprises a controller to instruct the shifter when to shift up a value of the control word, shift down the value of the control word, or maintain the value of the control word, wherein the controller is to shift up or shift in non-monotonic manner to reduce error between a reference beat frequency and a beat frequency of a free-running oscillator.

In some embodiments, the controller operates in retention mode or wakeup mode. In some embodiments, in the retention mode, the controller instructs the shifters to shift up the value of the control word when a voltage on the output power supply rail is less than a retention voltage and when the voltage on the output power supply rail has a negative slope or substantially zero slope. In some embodiments, in the retention mode, the controller instructs the shifter to shift down the value of the control word when a voltage on the output power supply rail is greater than a retention voltage and when the voltage on the output power supply rail has a positive slope. In some embodiments, the controller instructs the shifter to shift down the value of the control word when a voltage on the output power supply rail is greater than a retention voltage and when the voltage on the output power supply rail is larger than a reference slope. In some embodiments, reference slope is a variable slope.

In some embodiments, in the wakeup mode, the controller instructs the shifter to shift up the value of the control word if a slope of a voltage on the output power supply rail is less than or equal than a reference slope. In some embodiments, in the wakeup mode, the controller instructs the shifter to maintain the value of the control word if a slope of a voltage on the output power supply rail is greater than a reference slope. In some embodiments, the free-running oscillator generates a first clock, wherein the apparatus comprises a clock synchronizer synchronizes the first clock with a second clock. In some embodiments, the controller comprises a counter, wherein the clock synchronizer generates a third clock, and wherein the counter determines the frequency of the first clock via the third clock. In some embodiments, the counter receives the second clock. In some embodiments, the controller comprises a first comparator that compares an output of the counter with a digital value indicating a past frequency count of the first clock, and wherein the first comparator generates an output indicative of a direction in change in frequency of the first clock relative the past frequency count.

In some embodiments, the controller comprises a second comparator to compare the output of the counter with a reference frequency count, wherein the second comparator generates an output indicating an error between the first clock relative to the reference frequency count. In some embodiments, the apparatus comprises a logic to generate the control word according to the outputs of the first and second comparators. In some embodiments, the plurality of power gates comprises p-type devices. In some embodiments, the controller instructs the shifter when to shift up a value of the control word, shift down the value of the control word, or maintain the value of the control word, wherein the controller shifts the value of the control word such that the control word with small change in the value is modified faster than the control word with larger change in the value.

There are many technical effects of the various embodiments. For example, exit times from low power states (e.g., C1LP and C6 states) are reduced with the scheme of various embodiments. The scheme of various embodiments enables fine-grain power savings in different low power states. Due to its low-cost implementation, net power savings achieved by the improved controller improve the performance per watt for thermally limited system-on-chips (SoCs). Other technical effects will be evident from the various figures and embodiments.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

FIG. 1 illustrates a mixed signal low dropout (LDO) regulator 100. LDO regulator 100 comprises a plurality of power gate transistors 101 coupled to an input power supply rail $V_{in}$ (which is to provide input power $V_{in}$) and an output power supply rail $V_{out}$ (which is to provide an output power supply $V_{out}$). Here, 'N' power gate transistors are shown as transistors $MP_1$ through $MP_N$ that are operable to be turned on or off by a digital control. The digital control may be a bus or a codeword that indicates which transistors to turn on. In some embodiments, the power gate transistors $MP_1$ through $MP_N$ are binary weighted. In some embodiments, the power gate transistors $MP_1$ through $MP_N$ are thermometer weighted. The plurality of power gate transistors 101 are driven by an up/down shifter 102 that increments or decrements the value of the control codeword. In a traditional LDO, the up/down shifter 102 is instructed to shift the codeword up or down in value according to an output of comparator 103. Comparator 103 may be a clocked comparator that compares an analog reference $V_{ref}$ with the analog voltage $V_{out}$ every $T_{clk}$ cycle. The output of comparator 103 is an error e(t) which varies with time and is updated every $T_{clk}$ cycle.

With various power staving modes, LDO 100 is expected to provide a stable output power supply Vout on the output supply rail $V_{ow}$ for different input power supply voltage levels on $V_{in}$, and also for different $V_{ref}$ values. Here, node names and signal names are interchangeably used. For example, $V_{out}$ may refer to output voltage or supply rail or node depending on the context of the sentence. Further, load 104 may change its current loading requirements for different power modes, and LDO 100 is expected to provide little to no ripple on the output power supply rail $V_{out}$ during loading condition changes. Here, the load is represented as capacitor $C_{load}$ and resistor $R_{load}$ in parallel to the capacitor $C_{load}$. The load 104 can be any suitable load such a processor core, cache, IO (input-output) circuitries, etc.

LDO regulator 100, however, has a limited $V_{out}$ range (e.g., $V_{out}$ is approx. equal to $V_{RETENTION}$) and light leakage-based load current target that can vary exponentially across process, voltage, and temperature (PVT) and aging. Here, $V_{RETENTION}$ is the minimum voltage provided on the output power supply rail $V_{out}$ that allows various circuitries and logic gates to remain operational without losing their state values. Under highly variable light load current situation, maintaining the stability of the LDO (translated to low $V_{out}$ ripple) is a challenge.

One way to provide a stable LDO is using a mixed signal proportional-derivative (PD) control scheme which allows the loop integrator of LDO 100 to adapt its accumulation at a rate close to the output pole (which is a function of the load current at a given point in time) to avoid instability. However, converting LDO 100 of FIG. 1 with a mixed signal proportional-derivative (PD) control scheme requires additional capacitors and careful design, which cause issues and challenges with scaling the circuit architecture to different technology nodes.

For LDO 100, comparator 103 samples $V_{out}$ and compares it to $V_{ref}$ every $T_{clk}$ period (where $V_{ref}=V_{RETENTION}$ for this particular retention case). At a given time (t), the loop integrator is incremented or decremented based on the error $e(t)=V_{out}-V_{ref}$, as follows: If e(t) less than 0 then increment loop integrator and increase the strength of power gate 101; Else if e(t) is greater than 0 then decrement loop integrator and decrease the strength of power gate 101. Here, adjusting the strength of power gate 101 refers to adjusting amount of current sourced to the $V_{out}$ power supply rail. During steady state, the minimum error of LDO 100 is 1 LSB (least significant bit). To maintain loop stability under all cases the following condition is to be satisfied:

$T_{clk}>T_{PATH}+K*T_{LOAD}$, where $T_{PATH}$ is the total latency from comparator 103 to the power gates 101, and $T_{LOAD}$ is approximately $R_{load}C_{load}$ and represents the inverse of the output pole which is a function of both the load current (represented by $R_{LOAD}$) and decoupling cap ($C_{load}$). In other words, $T_{clk}$ needs to be set at a rate lower than the rate of change of $V_{out}$ to allow $V_{out}$ to settle before taking the next increment/decrement decision. Under a leakage current load scenario (e.g. during retention) of a fast die and hot temperature (e.g., temperature greater than or near 100 degree Celsius), leakage current is high and so $R_{load}$ is small resulting is small $T_{LOAD}$ and so $T_{clk}$ needs to be relatively fast. The opposite is true for a slow die and cold temperature (e.g., temperatures near 0 degrees Celsius). These conflicting conditions on $T_{clk}$ makes it harder to maintain loop stability specially under exponentially varying load current due to process, temperature, or aging variations.

One possible method to deal with this dilemma is to adapt $T_{clk}$ based on sensing the load current, where the number of power gates turned on at a given time is used as an indication of the load current. If this number is above certain threshold, then $T_{clk}$ is made smaller (i.e., faster) and vice-versa. This scheme is not practical, however, under very wide load current range as explained with reference to FIG. 2.

Figure 2:
FIG. 2 illustrates a table showing a wide range of power gates that are enabled or disabled for the LDO of FIG. 1 to provide a particular low voltage supply output using two different input power supply levels.

FIG. 2 illustrates table 200 showing a wide range of power gates that need to be enabled or disabled for the LDO of FIG. 1 to provide a particular low voltage supply output using two different input power supply levels. Table 200 shows leakage current for a typical processor core under $V_{out}=V_{RETENTION}=0.55$ V showing a substantially large difference in number of on power gates even for the same die process corner due to $V_{in}$ and temperature variations. In this example, when $V_{in}$ is 1.15 V, the range of power gates is from 1 to 34, and when $V_{in}$ is 0.75 V, the range of power gates is from 1 to 54. A look up table and extensive calibration may be needed for this scheme to work.

Figure 3A:
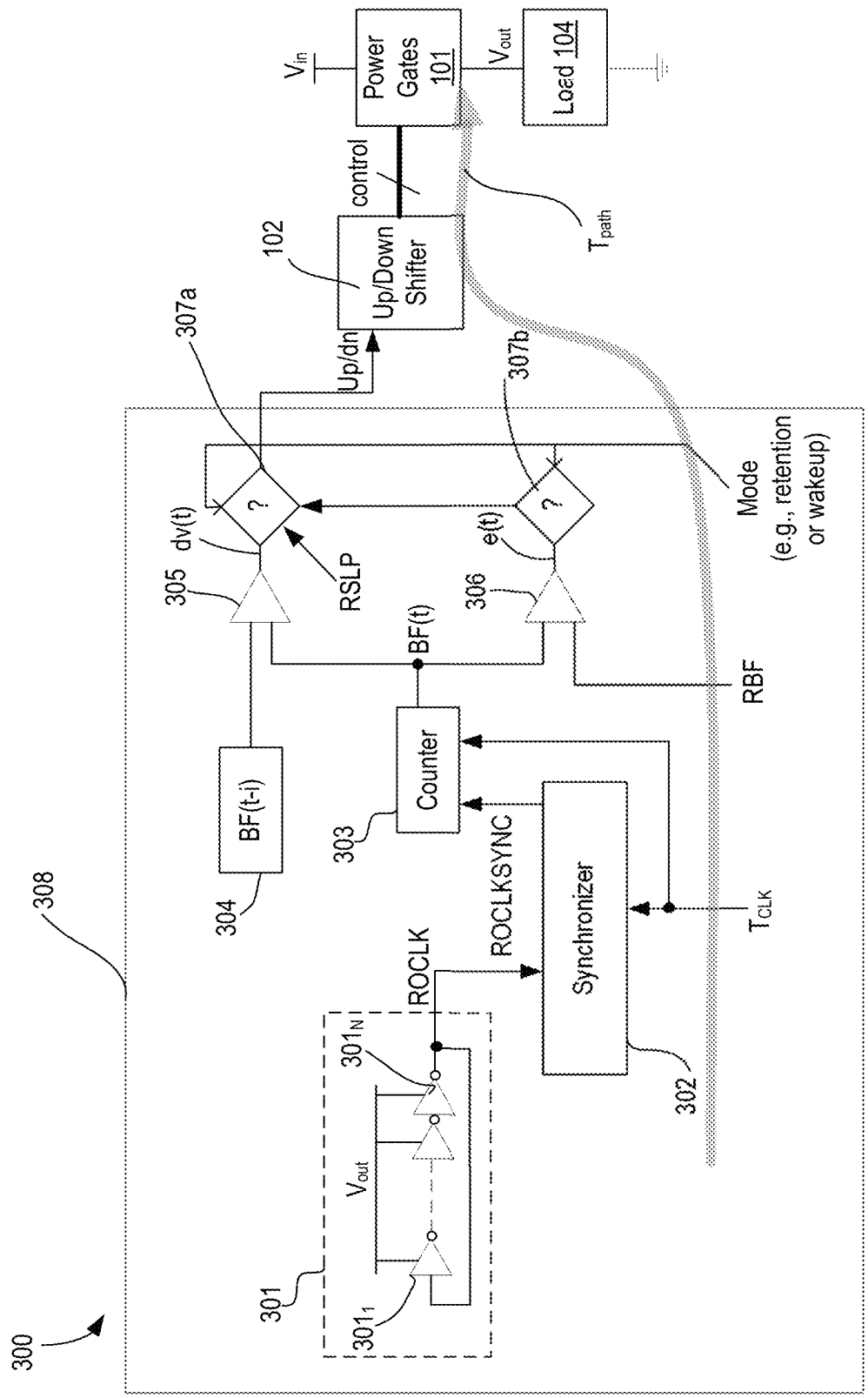
FIG. 3A illustrates an apparatus comprising an all-digital proportional derivative (PD) controller for retention clamp and adaptive wake-up modes, in accordance with some embodiments.

FIG. 3A illustrates apparatus 300 comprising an all-digital proportional derivative (PD) controller for retention clamp and adaptive wake-up modes, in accordance with some embodiments. In some embodiments, comparator 103 is replaced with an all-digital PD controller 308 which comprises: an oscillator 301, a synchronizer 302, a counter 303, a storage device 304 for storing a previous or past beat frequency, comparators 305 and 306 and logic 307a and 307b.

In some embodiments, oscillator 301 is a free running ring oscillator which is powered by the voltage provided by the output power supply rail $V_{out}$. In this example, N number of inverters ($301_{1-N}$) are coupled together in a ring formation. The embodiments are not limited to this specific ring oscillator style. Any suitable oscillator powered by $V_{out}$ can be used to generate ROCLK. ROCLK may be unrelated to $T_{clk}$, which is used by counter 303. For example, $T_{clk}$ may be generated by a phase locked loop (PLL). As such, in some embodiments, synchronizer 302 is used to synchronize the two clocks—$T_{clk}$ and ROCLK—and generate a synchronized version of the ROCLK called ROCLKSYNC. In various embodiments, Up/down shift counter 102 is controlled by a state-machine which has different conditional checks depending on whether retention mode or wake-up mode is selected.

In some embodiments, apparatus 300 finds the beat frequency BF(t) of free-running oscillator 301 (also referred to as RO sensor 301) every Talk cycle during retention. BF(t) is found by counting the number of RO cycles in one $T_{clk}$. In various embodiments, a binary counter 303 is used for counting the number of RO cycles from the ROCLKSYNC signal. Any suitable counter can be used for implementing counter 303. In retention mode, the BF(t) is compared with a reference beat frequency (RBF) by comparator 306. The comparison results in an error signal e(t). Any suitable low power comparator may be used for implementing comparator 306. Here, the RBF may be found per die (or per a population of dies) during class test when running the RO sensor 301 at $V_{RETENTION}$ condition (e.g., at hot conditions). In some embodiments, RBF is a programmable value that can be adjusted using software (e.g., operating system) or hardware (e.g., fuses). In some embodiments, RBF is stored in a non-volatile memory (NVM). In various embodiments, proportional-differential (PD) controller 308 also includes comparator 305 to compare BF(t) with a previous or past BF(t) value (e.g., BF(t–i)). The output of comparator 306 indicates a slope or derivative dv(t) of the BF. The previous value may be the immediate previous value or some past value that can indicate a trend in the beat frequency.

The loop integrator (which comprises power gates 101) is incremented, decremented, or remains unchanged by logic 307a and 307b based on 1) the current error defined as e(t)=BF(t)–RBF, and 2) derivative of $V_{OUT}$ defined as dv(t) =BF(t)–BF(t–i), where i≥1 and BF(t–i) is the BF stored as a digital code of the RO in cycle t–i, as follows:

If [e(t)<0) AND (dv(t)<Thresh] then increment loop integrator

Else if [e(t)>0) AND (dv(t)≥Thresh] then decrement loop integrator

Else loop integrator remains unchanged

Here, Thresh is a predetermined value or a programmable variable threshold that can be programmed by hardware, software, or a combination of both. Various embodiments are described with reference to Thresh being 0. However, other values may be used.

The integrator is incremented when $V_{out}$ is less than $V_{RETENTION}$ (the proportional term) while at the same time $V_{out}$ also has a slope less than 'Thresh' (derivative term). Similarly, the loop integrator is decremented when $V_{out}$ is larger than $V_{RETENTION}$, while at the same time $V_{out}$ is also trending upward with slope greater than 'Thresh'. Otherwise, the loop integrator value is kept unchanged.

In some embodiments, a small subset of power gates 101—called primary power gates (PPGs)—are simultaneously activated using an analog voltage as gate control. By going from all OFF state to all ON states, for example in 16 steps of gate control voltage, fast, di/dt and reliability friendly wake-up is achieved. In some embodiments, gate voltage (VGS) around the threshold voltage of the PMOS power gate transistor has larger impact on drain-current change and wake up speed. It is then desirable to start waking up from around that point and hence more resolution of control voltage is required around that voltage point. Due to the inter-die and/or intra-die variation, introduction of finer voltage steps around threshold voltage is difficult and calibration of such control is time consuming and challenging. Hence, the fastest wake-up scheme is limited by the step which generates largest current change.

In some embodiments, the adaptive wake-up scheme is implemented by enabling the wakeup mode. In this cause, the output of comparator 306 is not used since controller 308 in wakeup mode is not regulating to a specific voltage. Instead, the dv(t) is compared against a reference slope RSLP by logic 307a. RSLP is found per die (or per a population of dies) during class test when running the RO sensor at two voltages: (a) $V_{RETENTION}$, HOT, or BOL condition and at (b) $V_{RETENTION}+\Delta V$, HOT, or BOL condition and taking difference between respective BF(t) values. $\Delta V$ is the safest allowable voltage change in Tax time-period that satisfies di/dt and FiSH constraints as determined by simulations, in accordance with some embodiments. In some embodiments, logic performed by logic 307a comprises:

If [dv(t)≤RSLP]→increment loop integrator

Else→loop integrator remains unchanged

With the apparatus of some embodiments, $T_{clk}$ is set independent of 1) load current variation due to process/temperature/aging, 2) decoupling capacitor, and 3) input supply voltage $V_{in}$. In some cases, $T_{clk}$ can be set to the lowest possible delay (e.g., greater than $T_{PATH}$) with the highest possible frequency while PD controller 308 automatically allows the loop integrator to adapt its accumulation at a rate close to the output pole to avoid instability. Setting $T_{clk}$ to the lowest possible (e.g., greater than $T_{PATH}$) can be useful for fast response to a voltage droop for a more general use scenario of controller 308 where the load current can exhibit fast di/dt event (a case that may not happen during retention).

In some embodiments, a power-gate mode (e.g., to power-gate the system) is provided with a feedback mechanism (opposite of the wakeup mode). In this power-gate mode, the code is decremented from a maximum value to zero in successive steps. If the slope of the voltage change (negative value since voltage is decreasing) is lower than –1×RSLP value then further decrement is prevented. In some embodiments, the code is maintained until the slope of voltage change is higher or equal to –1×RSLP. In some embodiments, this process is continued until code reaches zero. This feedback-based power-gate mode enables gradual lowering of voltage and current from the power-supply, which prevents voltage overshooting in the shared ungated rail. Note, overshooting is detrimental to circuits since it degrades reliability of transistors e.g. aging, electro-migration etc.

Figure 3B:
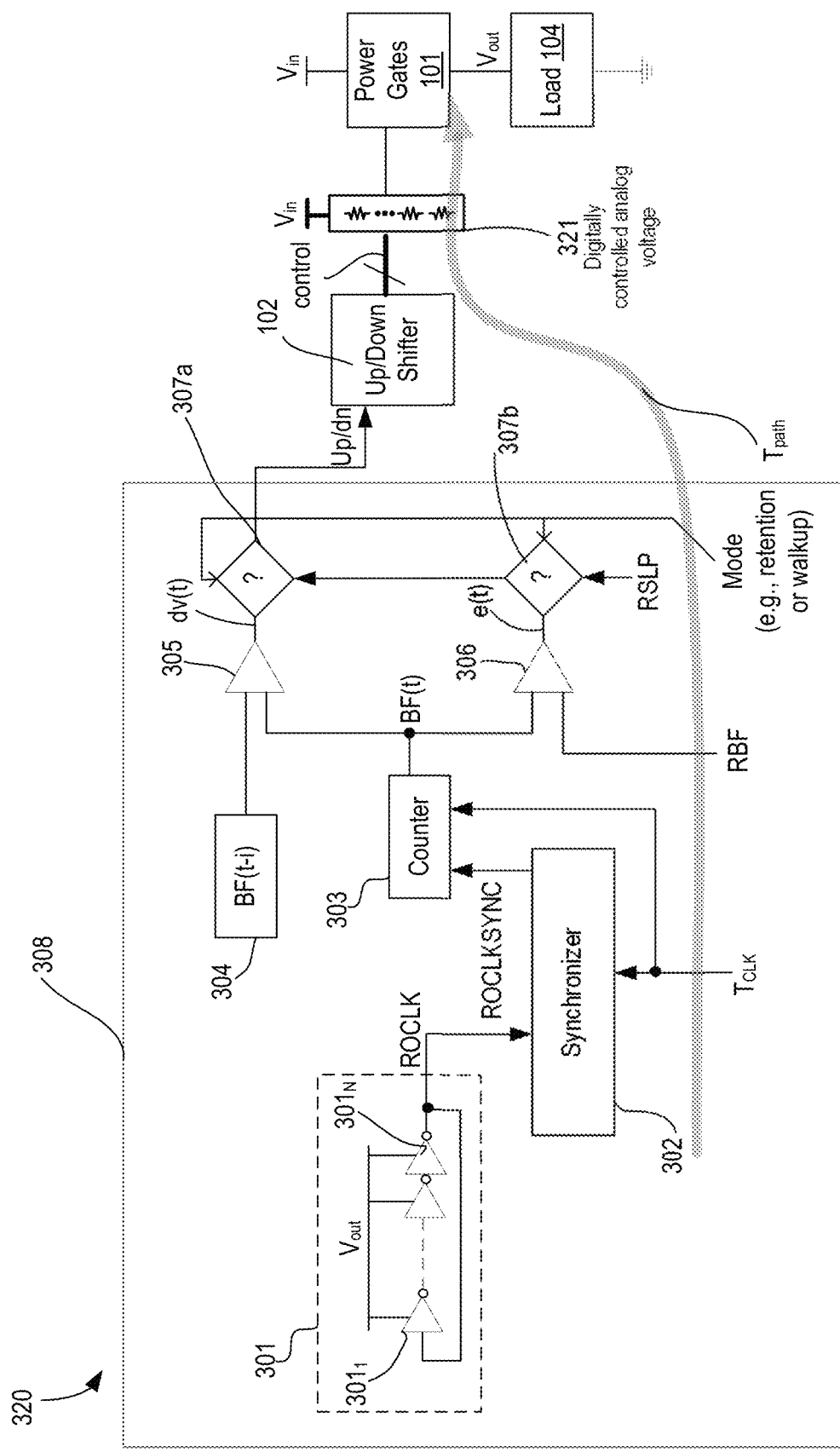
FIG. 3B illustrates an apparatus comprising a PD controller for retention clamp and adaptive wake-up modes, in accordance with some embodiments.

FIG. 3B illustrates apparatus 320 comprising an PD controller for retention clamp and adaptive wake-up modes, in accordance with some embodiments. Apparatus 320 is same as apparatus 300 but for digital-to-analog converter (DAC) 321 that converts control word from up/down shifter 102 to an analog voltage to bias power gates 101. The scheme of retention clamp and adaptive wake-up modes otherwise works same as that described with reference to FIG. 3A.

Figure 3C:
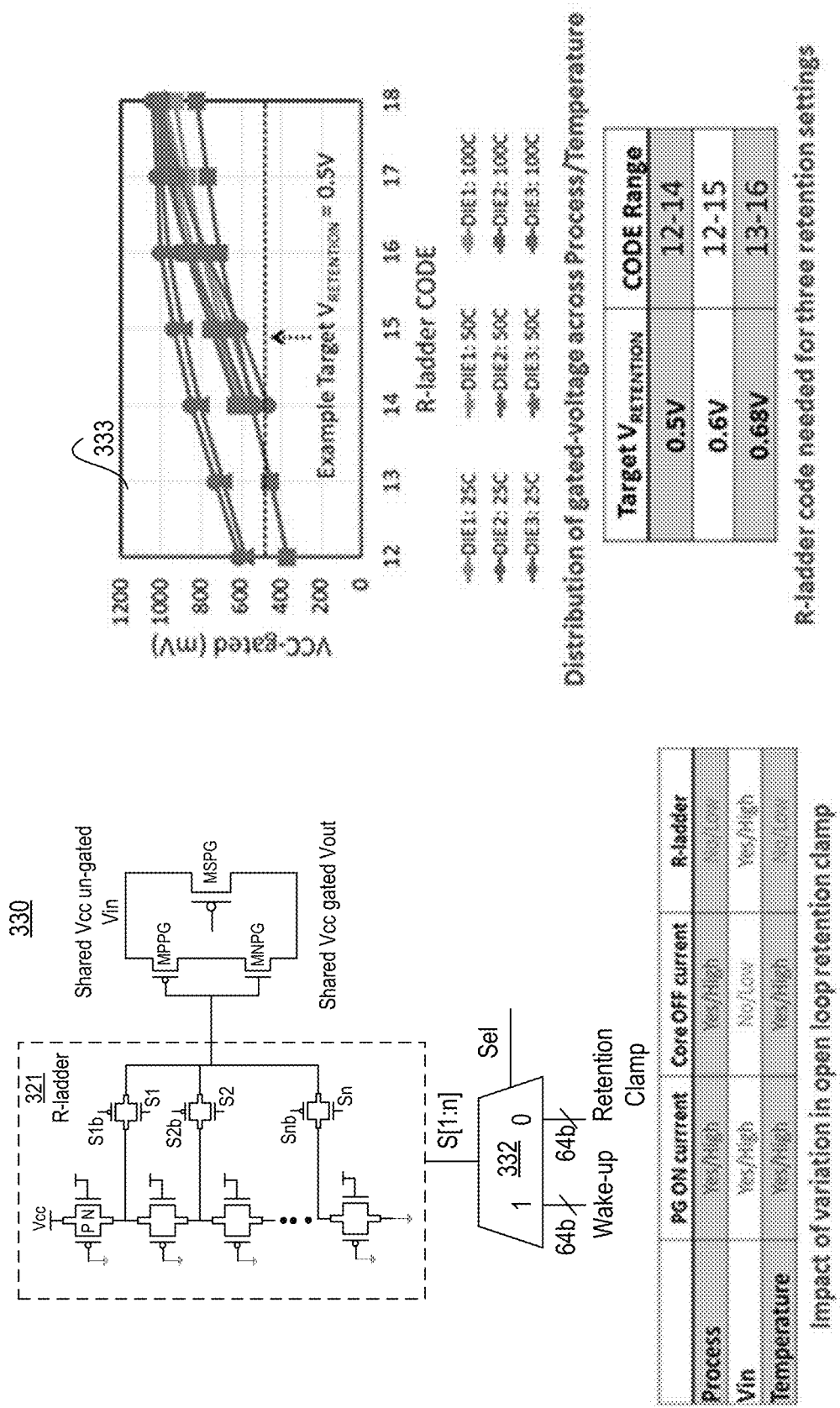
FIG. 3C illustrates a resistor ladder (R-ladder) based open loop retention clamp, in accordance with some embodiments.

FIG. 3C illustrates apparatus 330 showing resistor ladder (R-ladder) based open loop retention clamp, in accordance with some embodiments. Apparatus 300 comprises R-ladder 321 (which is a DAC) including a chain of pass-gates (comprising P and N transistors coupled in parallel). The chain of pass-gates is coupled to selectors (also pass-gates in this example). The selectors are controllable by signals S1 through Sn, and S1b through Snb, where S1b is an inverse of S1. Multiplexer 332 selects one or more of the selectors based on wake-up or retention clamp codes. The selection signals are digital signals, while the output of R-ladder 321 is analog, which makes R-ladder 321 a DAC. The output of R-ladder 321 is used to control the primary power gates (PPG) and secondary power gate(s) SPG. In this example, PPG comprises p-type gate MPPG and n-type gate MNPG coupled in series between shared Vcc un-gated supply rail Vin and shared Vcc gated supply rail Vout, as shown. The secondary power gate comprises a p-type MPSG between shared Vcc un-gated supply rail Vin and shared Vcc gated supply rail Vout, as shown. Here, the R-ladder input code S[1:n] is set once based on post-silicon tuning (left), and measured needed R-ladder code across 3 dies and 3 temperatures for 3 retention voltage targets (see plot 333).

Figure 3D:
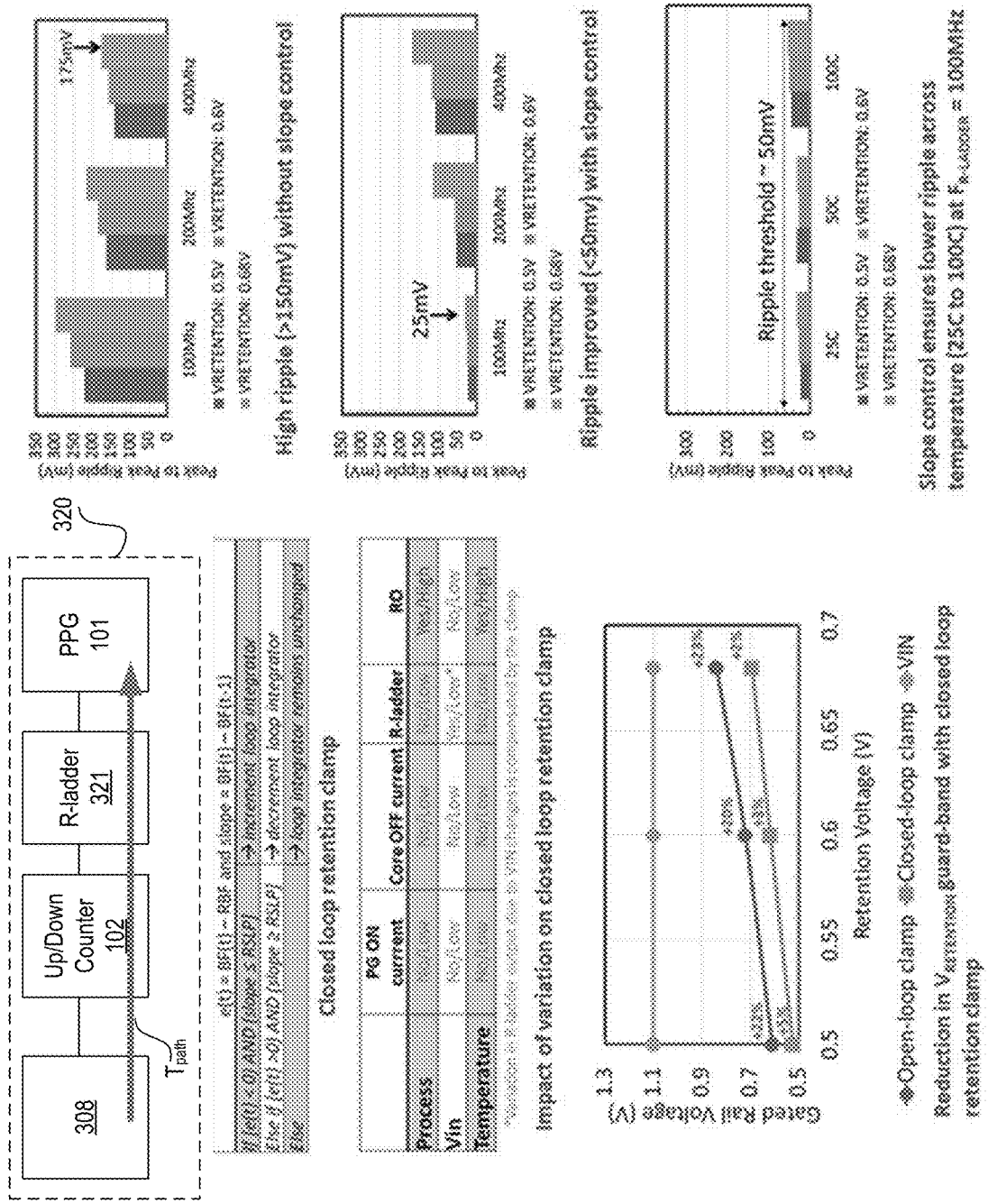
FIG. 3D illustrates a R-ladder based closed loop retention clamp, in accordance with some embodiments.

FIG. 3D illustrates R-ladder based closed loop retention clamp to support C1LP state. The R-ladder based closed loop retention clamp support C1LP state (top left), $V_{OUT}$ ripple with and without slope-based control across 100-400 MHz $F_{R-Ladder}$ and 25 C to 100 C (right) and reduction in retention voltage guard-band with closed loop clamp.

Figure 3E:
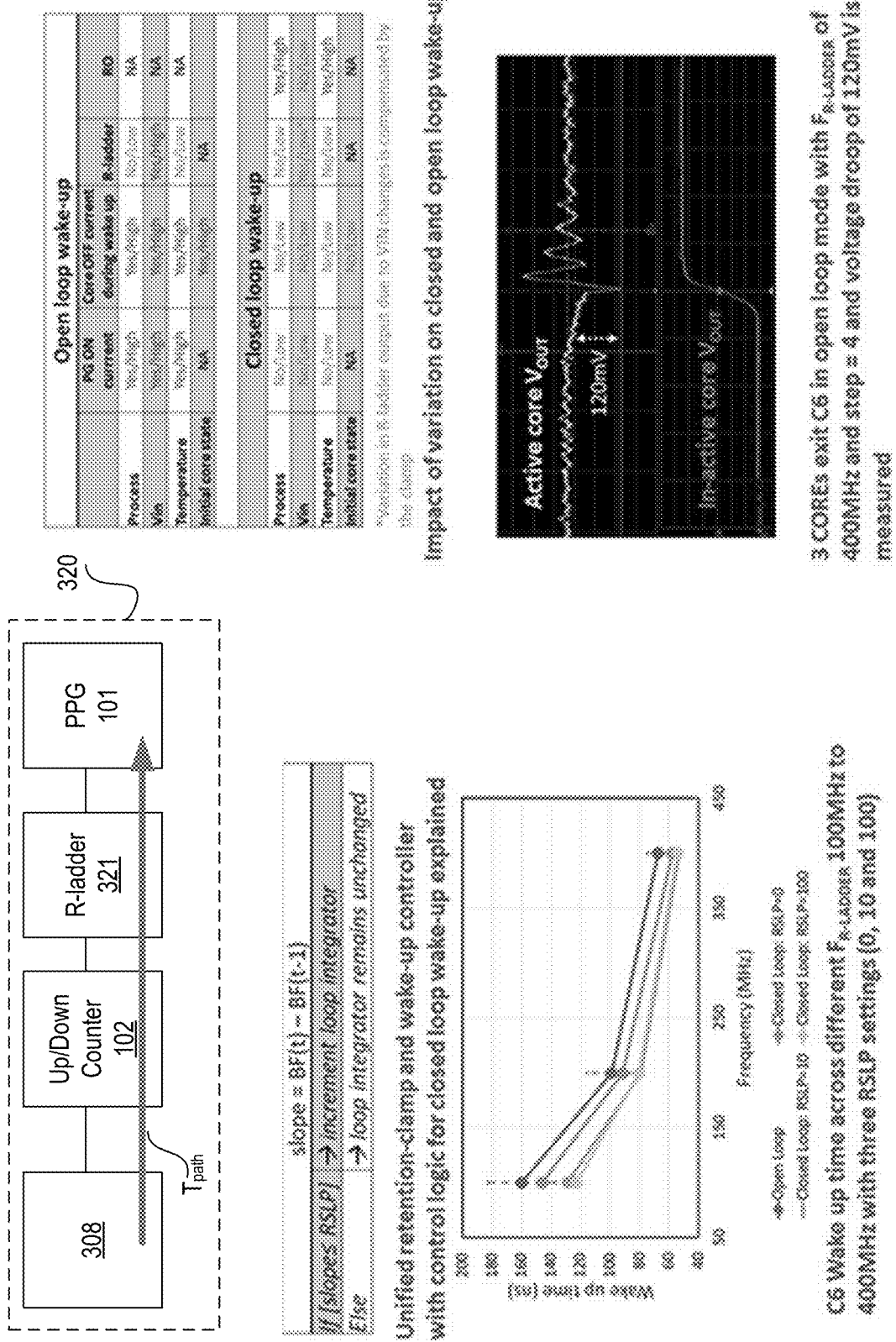
FIG. 3E illustrates a plot showing Vgs as function of current for a p-type transistor of a power gate.

FIG. 3E illustrates a close-loop retention/wake-up clamp, in accordance with some embodiments. Here, wake up time for both open and closed loop at different $F_{R\_LADDER}$ speeds (bot left), and measured worst-case droop for open loop wake up are shown.

In some embodiments, bang-bang controller 308 samples (every $T_{R-LADDER}$ step) the beat frequency BF(t) of the RO sensor at a given time (t) during retention. The controller then compares current BF(t) to a reference beat frequency (RBF), where RFB is found once post-silicon by running the RO sensor at the core $V_{RETENTION}$. The loop integrator is incremented, decremented, or remains unchanged as follows based on 1) the current error defined as e(t)=BF(t)−RBF, and 2) slope of Your defined as BF(t)−BF(t−i), where i≥1. The integrator is incremented (decremented) only when $V_{OUT}$ is smaller (larger) than $V_{RETENTION}$ while at the same time $V_{OUT}$ has a slope less (greater) than a threshold value, RSLP. Otherwise, the loop integrator value is kept unchanged. Some embodiments use a control scheme that allows the loop integrator to adapt its accumulation at a rate close to the output pole (which is a function of the load current at a given point in time) to avoid instability.

With the proposed scheme, $T_{R-LADDER}$ can be set (to a first order) independent of 1) load current variation due to PT and aging, 2) decoupling capacitor, and 3) $V_{INT}$. In theory, we can set $T_{R-LADDER}$ slightly greater than the lowest possible delay, $T_{PATH}$, representing latency from controller to PGs, while the controller automatically allows the loop integrator to adapt its accumulation at a rate close to the current output pole to avoid instability.

FIG. 3D gives measured $V_{OUT}$ with and without slope control for a typical die, at 50 C, $V_{IN}$=1.1V, $F_{R-LADDER}$=100 MHz-400 MHz, and target $V_{OUT}$ of 0.5V-0.68V. Worst-case voltage ripple (at $V_{OUT}$ target of 0.68V) is reduced from 175 mV with slope control disabled while needing to operate at $F_{R-LADDER}$=400 MHz to −25 mV while operating at a 4× lower $F_{R-LADDER}$ frequency of 100 MHz, thanks to the slope enhanced control. Furthermore, slope control ensures lower ripple at wide temperature range from 25 C to 100 C at a fixed $F_{R-LADDER}$ 100 MHz without the need to use some sort of adaptive control frequency as in [3], despite orders of magnitude of core leakage current change with temperature. Since the RO frequency changes across temperature for a given target $V_{RETENTION}$, we need to guard-band the reference RBF code.

FIG. 3D shows the guard-banded $V_{RETENTION}$ versus target $V_{RETENTION}$ at 50 C when considering worst-case operating temperature of 100 C and it is merely +5% higher with the closed loop clamp. In open-loop clamp case, however, 23% guard-band is needed to satisfy the temperature range. If we consider $V_{IN}$ variation as well, the guard-banded open loop $V_{RETENTION}$ becomes even beyond target $V_{RETENTION}$ resulting in no leakage power savings with C1LP.

Figure 3F:
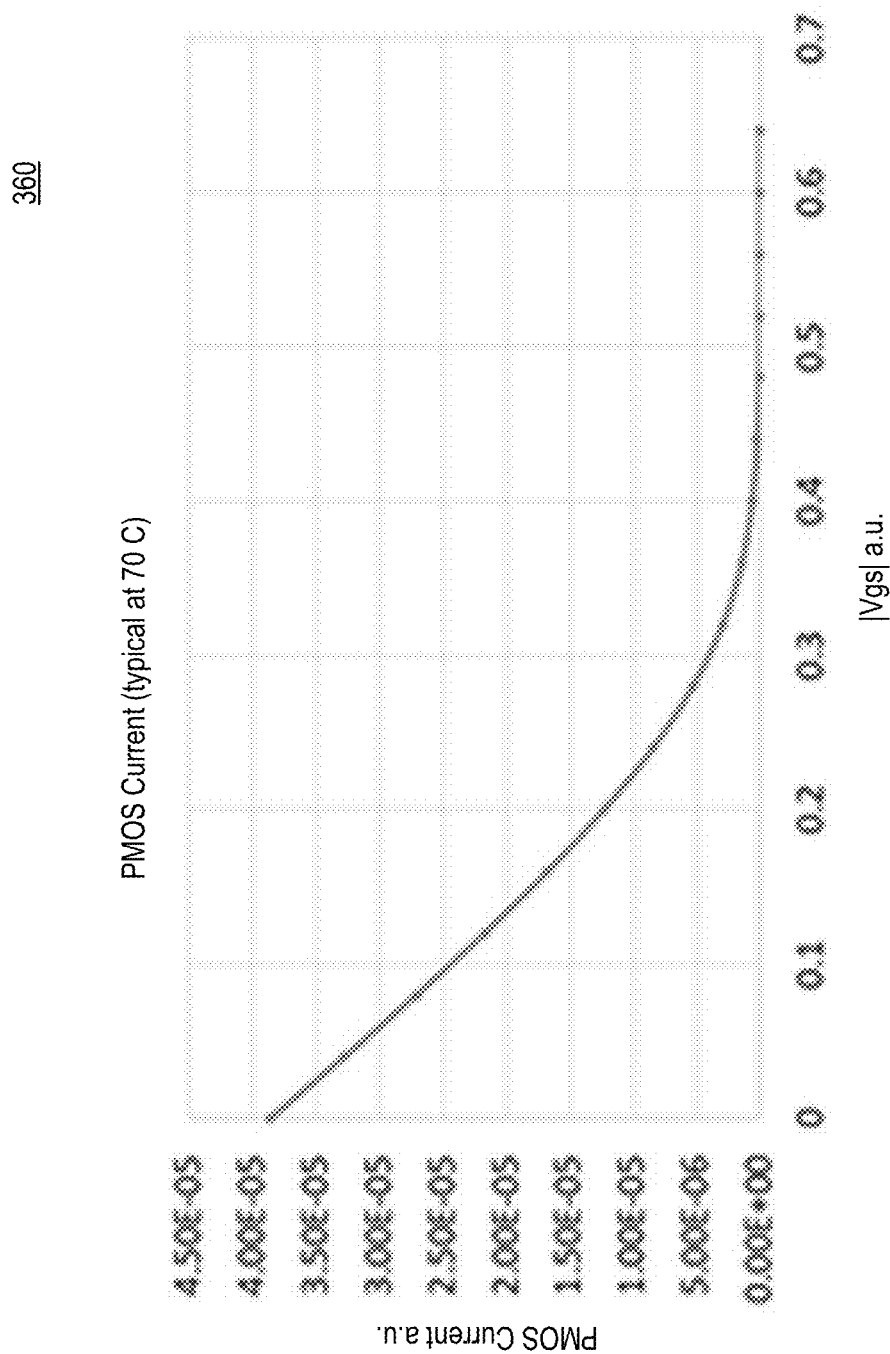
FIG. 3F illustrates a plot showing measured data of gate voltage ($V_{GS}$) around a threshold voltage of the p-type power gate that has larger impact on drain-current change and wake up speed.

In the R-ladder based open loop wake up design, PPGs are gradually activated using R-ladder analog output voltage as PG gate control as mentioned earlier. As shown in plot 360 showing measured data FIG. 3F, gate voltage ($V_{GS}$) around the threshold voltage of the PMOS PG has larger impact on drain-current change and wake up speed. It is then beneficial to start waking up from around that point and hence more resolution of control voltage is required around that voltage point. Due to the inter-die/intra-die variation, introduction of finer voltage steps around threshold voltage is difficult and calibration of such control is time consuming and challenging. Hence, the fastest wake-up scheme is limited by the step which generates largest current change.

For implementing the adaptive wake-up scheme, the closed loop clamp is used in a unified manner as illustrated in FIGS. 3A-B and FIG. 3D. The comparison against RBF is not needed since we are not regulating to a specific voltage. Instead the current slope information is compared against a reference slope RSLP which is found per die (or per a population of dies) during manufacturing test and taking RSLP as the safest allowable voltage change in $T_{R-LADDER}$ time period that satisfies reliability and di/dt constraints. In this closed loop scheme, wake-up time can be further improved by starting the R-LADDER from a non-zero CODE, for example from a WARM-UP-CODE, which skips the initial 'K' steps that does not contribute to current as shown by VGS larger than 0.45V. This WARM-UP-CODE can also be made programmable.

Figure 4:
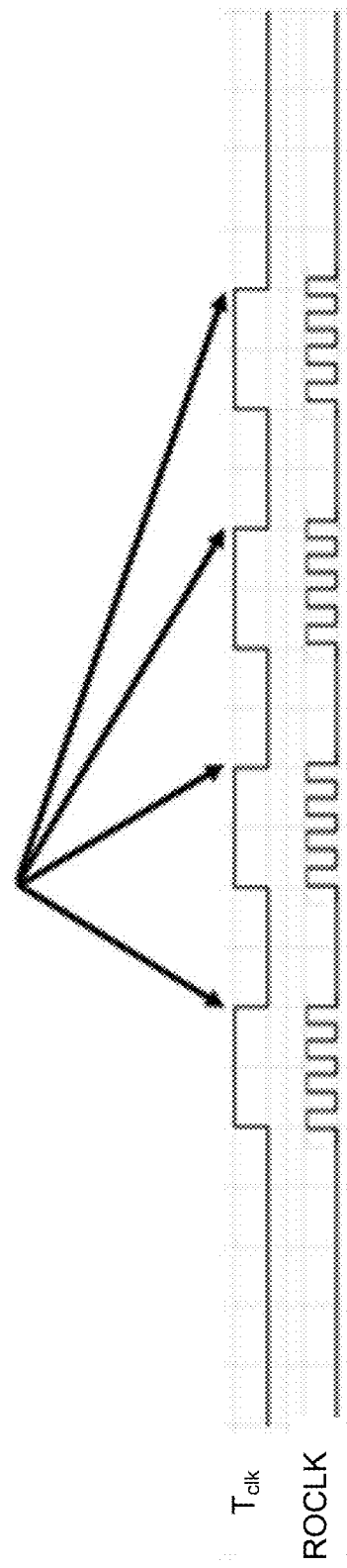
FIG. 4 illustrates a timing diagram of the clocks of the apparatus of FIG. 3A, in accordance with some embodiments.

FIG. 4 illustrates timing diagram 400 of the clocks of the apparatus of FIGS. 3A-B and FIG. 3D, in accordance with some embodiments. To address clock synchronization between the sampling clock, $T_{clk}$, which runs up to, for example, a few 100's MHz and the ring oscillator clock ROCLK running at multiples of GHz, ROCLK is activated during the positive phase of $T_{clk}$ and the counter output is sampled on the next positive edge of $T_{clk}$ as illustrated by timing diagram 400. However, stopping ROCLK abruptly (e.g., asynchronously) may result in minimum delay (or hold time) failure in counter 303. To address this problem, in some embodiments, ROCLK is synchronized with $T_{CLK}$ before feeding the counter 303 using the synchronizer logic illustrated in FIG. 5.

Figure 5:
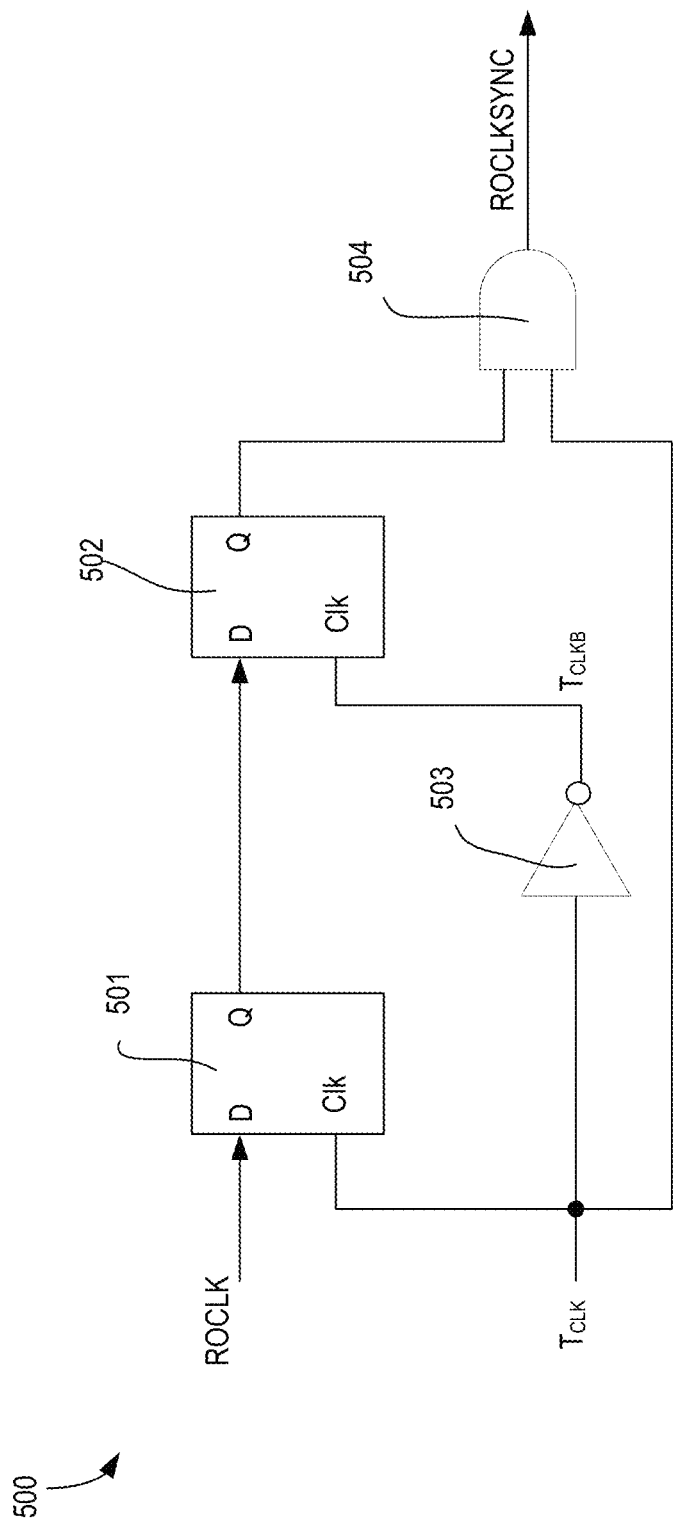
FIG. 5 illustrates a synchronizer logic between two clocks of the apparatuses of FIGS. 3A-B, in accordance with some embodiments.

FIG. 5 illustrates synchronizer logic 500 between two clocks of the apparatuses of FIGS. 3A-B, in accordance with some embodiments. Logic 500 comprises flip-flops 501 and 502, inverter 503, and AND logic gate 504 coupled together as shown. ROCLK is received by flip-flop 501 at its data port (D) and sampled by $T_{clk}$. The inverted version of $T_{clk}$ is then used to sample the output Q of flip-flop 501 by flip-flop 502. The AND logic gate 504 then performs an AND logic function between $T_{clk}$ and the output Q of flip-flop 502. The output of AND logic gate 504 is ROCLKSYNC.

Figure 6A:
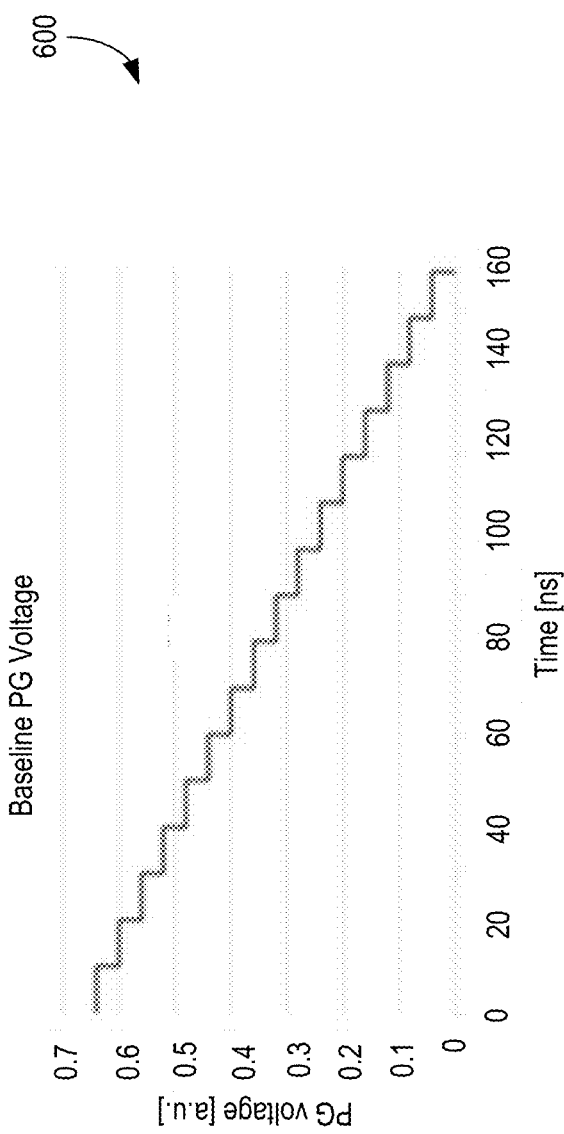
FIGS. 6A-B illustrate plots showing power gate (PG) voltage during exit from low power state using baseline design and apparatus(us) of FIGS. 3A-B, respectively, in accordance with some embodiments.
Figure 6B:
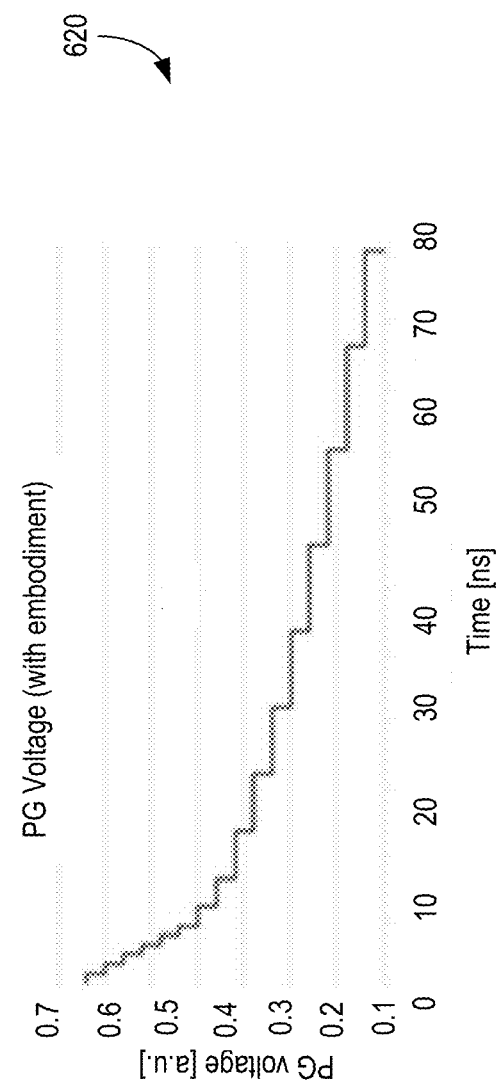

FIGS. 6A-B illustrate plots 600 and 620 showing power gate (PG) voltage during exit from low power state using baseline design and apparatus(us) of FIGS. 3A-B, respectively, in accordance with some embodiments.

Figure 7A:
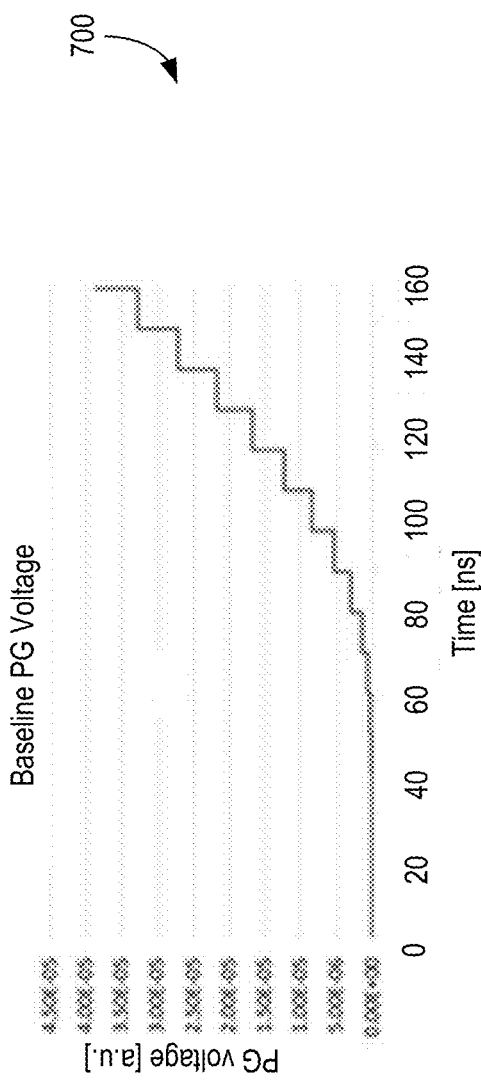
FIGS. 7A-B illustrate plots showing PG current during exit from low power state using baseline design and apparatus(us) of FIGS. 3A-B, respectively, in accordance with some embodiments.
Figure 7B:
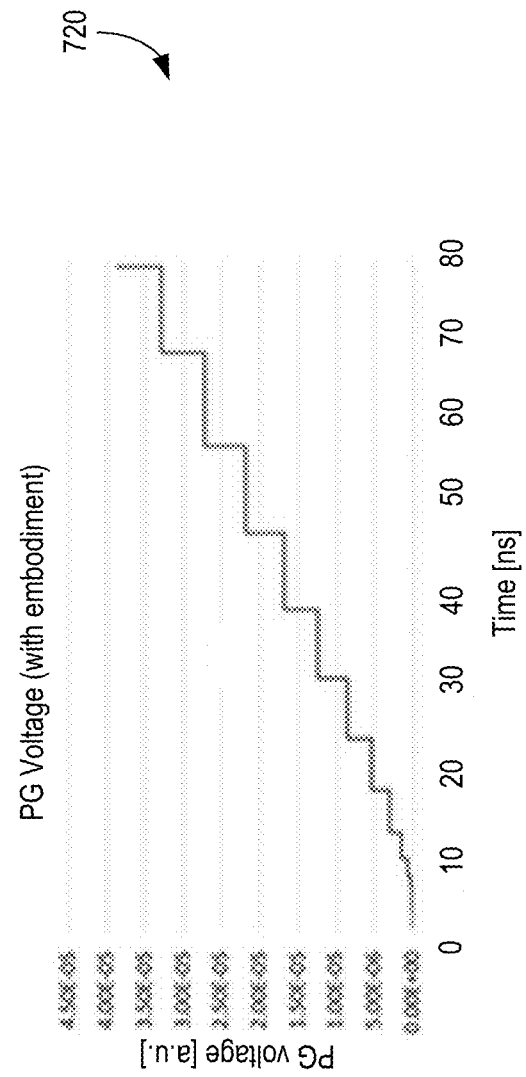

FIGS. 7A-B illustrate plots 700 and 720 showing PG current during exit from low power state using baseline design and apparatus(us) of FIGS. 3A-B, respectively, in accordance with some embodiments.

Figure 8A:
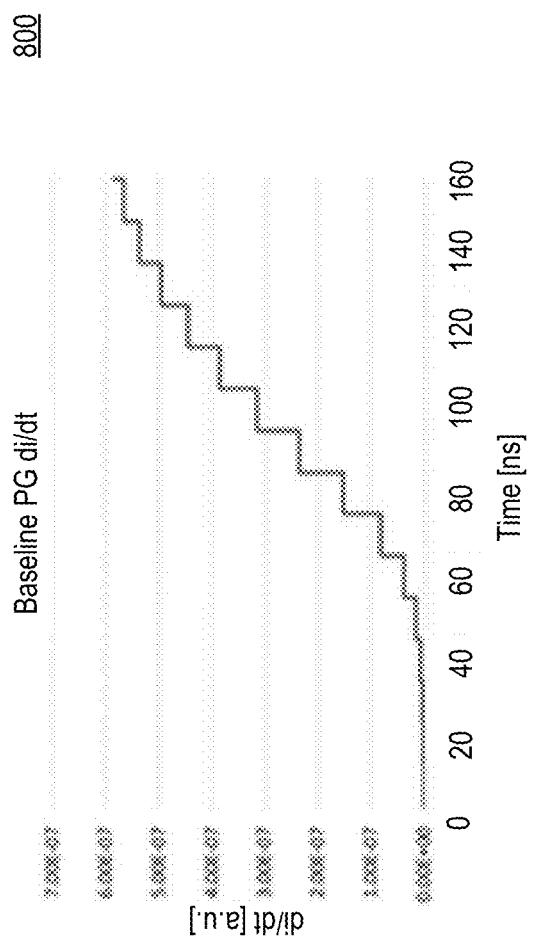
FIGS. 8A-B illustrate plots showing PG di/dt during exit from low power state using baseline design and apparatus (us) of FIGS. 3A-B, respectively, in accordance with some embodiments.
Figure 8B:
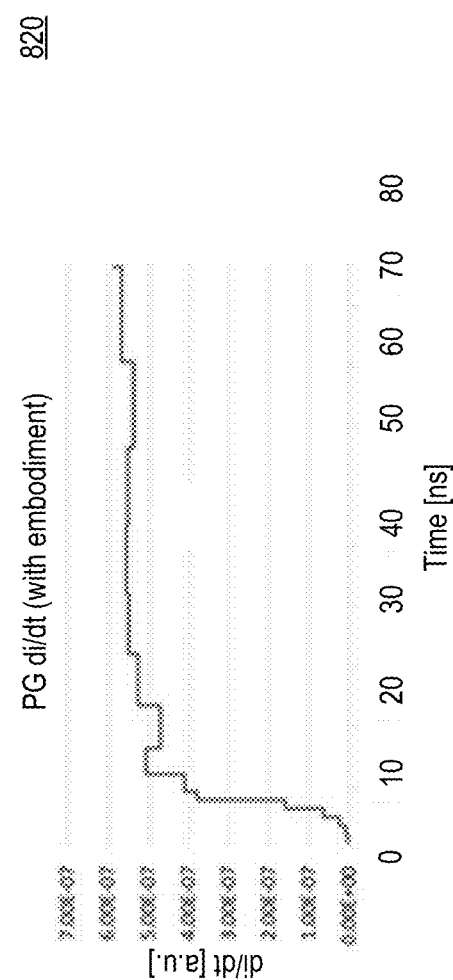

FIGS. 8A-B illustrate plots 800 and 820 showing PG di/dt during exit from low power state using baseline design and apparatus(us) of FIGS. 3A-B, respectively, in accordance with some embodiments.

Figure 9:
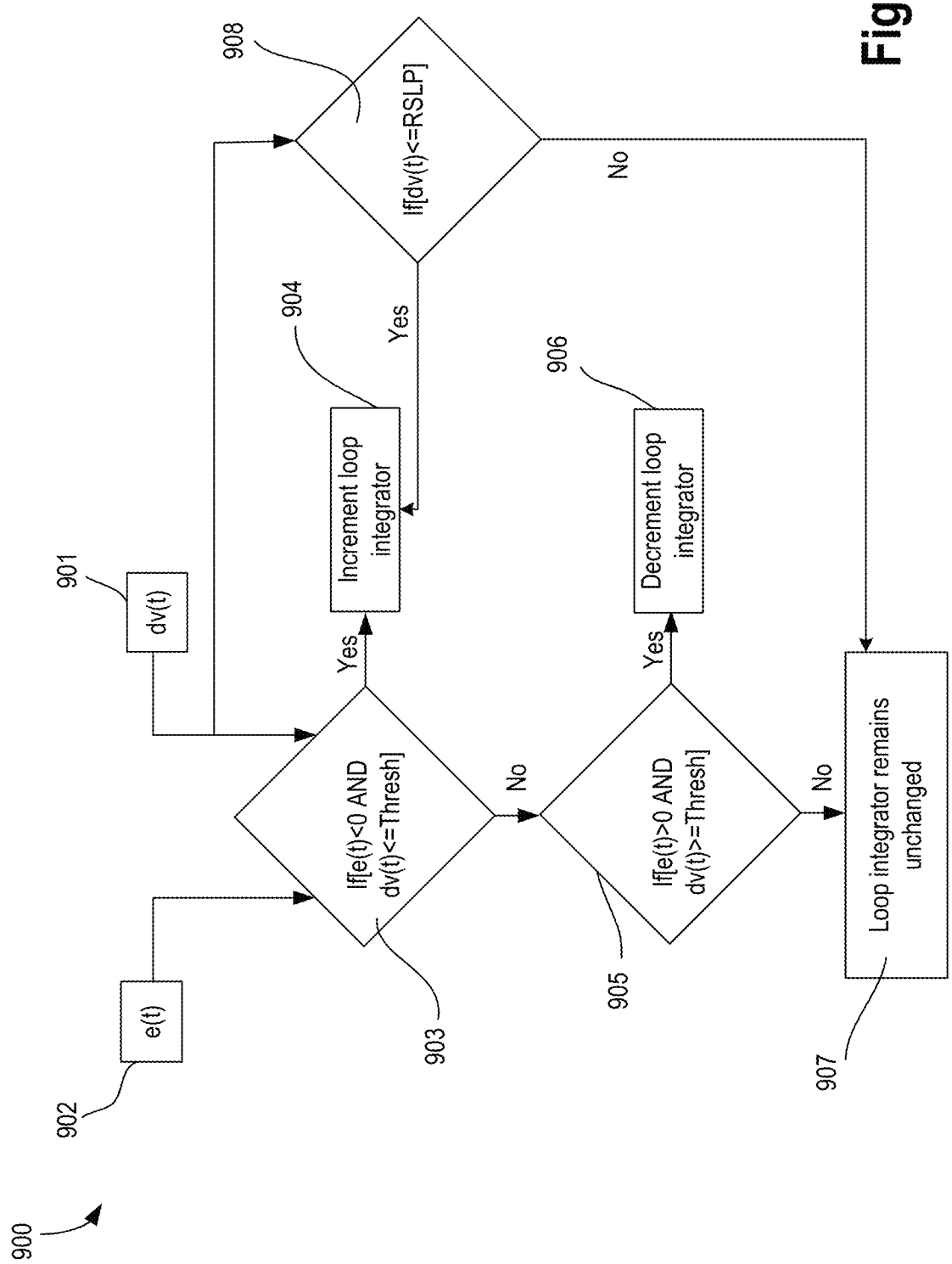
FIG. 9 illustrates a method for controlling power gates of the apparatus(us) of FIGS. 3A-B, in accordance with some embodiments.

FIG. 9 illustrates method 900 for controlling power gates of the apparatus(us) of FIGS. 3A-B, in accordance with some embodiments. While the blocks are illustrated in a certain order, the order can be modified. For example, some block can be performed before others or simultaneously without changing the essence of the embodiments. Blocks 901, 902, 903, 904, 905, and 906 are applicable for retention mode. Blocks 902, 904, 907, and 908 are applicable for wakeup mode. The blocks can be performed by hardware, software, or a combination of both.

At block 901, the slope or derivative dv(t) is determined. For example, dv(t) is generated by comparator 305 and provided to logic 307. At block 902, the error e(t) is determined. For example, error e(t) is generated by comparator 306 and provided to logic 307.

At block 903, logic 307 determines whether e(t) is less than or equal to zero and whether dv(t) less than or equal to Thresh (e.g., 0). If both conditions are true, then loop integrator is incremented and the output Up is asserted for Up/Down shifter 102 as indicated by block 904. Up/down shifter 102 then turns on an additional one or more power gate transistors. In some embodiments, block 904 can take an additional input WARM-UP-CODE which starts the LOOP INTEGRATOR from non-zero state of WARM-UP-CODE, when the CORE is waking up from C6 state.

At block 905, logic 307 determines whether e(t) is greater than zero and whether dv(t) is greater than or equal to Thresh (e.g., 0). If both conditions are true, then loop integrator is decremented and the output down is asserted (or Up is de-asserted) for Up/Down shifter 102 as indicated by block 906. Up/down shifter 102 then turns off an additional one or more power gate transistors 101. If the conditions of blocks 903 and 905 are not met, then logic 307 proceeds to block 907 where it maintains the previous setting for Up/Down signal and the number of power gates that are on and off remain the same. The process then repeats itself back from blocks 901 and 902.

In some embodiments, during wakeup mode, logic 307a compares dv(t) with RSLP to determine whether to increment the loop integrator or to let it be the same value. At block 908 if it is determined that dv(t) is less than or equal to RSLP, then the processor proceeds to block 904, otherwise the process proceeds to block 907.

In some embodiments, the operations by logic 307 can be performed by software. Program software code/instructions associated with flowchart 900 (and/or various embodiments) and executed to implement embodiments of the disclosed subject matter may be implemented as part of an operating system or a specific application, component, program, object, module, routine, or other sequence of instructions or organization of sequences of instructions referred to as "program software code/instructions," "operating system program software code/instructions," "application program software code/instructions," or simply "software" or firmware embedded in processor. In some embodiments, the program software code/instructions associated with flowchart 900 (and/or various embodiments) are executed by a processor or logic.

In some embodiments, the program software code/instructions associated with flowchart 900 (and/or various embodiments) are stored in a computer executable storage medium and executed by a processor (or processor core). Here, computer executable storage medium is a tangible machine-readable medium that can be used to store program software code/instructions and data that, when executed by a computing device, causes one or more processors to perform a method(s) as may be recited in one or more accompanying claims directed to the disclosed subject matter.

The tangible machine-readable medium may include storage of the executable software program code/instructions and data in various tangible locations, including for example ROM, volatile RAM, non-volatile memory and/or cache and/or other tangible memory as referenced in the present application. Portions of this program software code/instructions and/or data may be stored in any one of these storage and memory devices. Further, the program software code/instructions can be obtained from other storage, including, e.g., through centralized servers or peer to peer networks and the like, including the Internet. Different portions of the software program code/instructions and data can be obtained at different times and in different communication sessions or in the same communication session.

The software program code/instructions (associated with flowchart 900 and other embodiments) and data can be obtained in their entirety prior to the execution of a respective software program or application by the computing device. Alternatively, portions of the software program code/instructions and data can be obtained dynamically, e.g., just in time, when needed for execution. Alternatively, some combination of these ways of obtaining the software program code/instructions and data may occur, e.g., for different applications, components, programs, objects, modules, routines or other sequences of instructions or organization of sequences of instructions, by way of example. Thus, it is not required that the data and instructions be on a tangible machine readable medium in entirety at a particular instance of time.

Examples of tangible computer-readable media include but are not limited to recordable and non-recordable type media such as volatile and non-volatile memory devices, read only memory (ROM), random access memory (RAM), flash memory devices, floppy and other removable disks, magnetic storage media, optical storage media (e.g., Compact Disk Read-Only Memory (CD ROMS), Digital Versatile Disks (DVDs), etc.), among others. The software program code/instructions may be temporarily stored in digital tangible communication links while implementing electrical, optical, acoustical or other forms of propagating signals, such as carrier waves, infrared signals, digital signals, etc. through such tangible communication links.

In general, tangible machine readable medium includes any tangible mechanism that provides (i.e., stores and/or transmits in digital form, e.g., data packets) information in a form accessible by a machine (i.e., a computing device), which may be included, e.g., in a communication device, a computing device, a network device, a personal digital assistant, a manufacturing tool, a mobile communication device, whether or not able to download and run applications and subsidized applications from the communication network, such as the Internet, e.g., an iPhone®, Galaxy®, Blackberry® Droid®, or the like, or any other device including a computing device. In one embodiment, processor-based system is in a form of or included within a PDA (personal digital assistant), a cellular phone, a notebook computer, a tablet, a game console, a set top box, an embedded system, a TV (television), a personal desktop computer, etc. Alternatively, the traditional communication applications and subsidized application(s) may be used in some embodiments of the disclosed subject matter.

Figure 10:
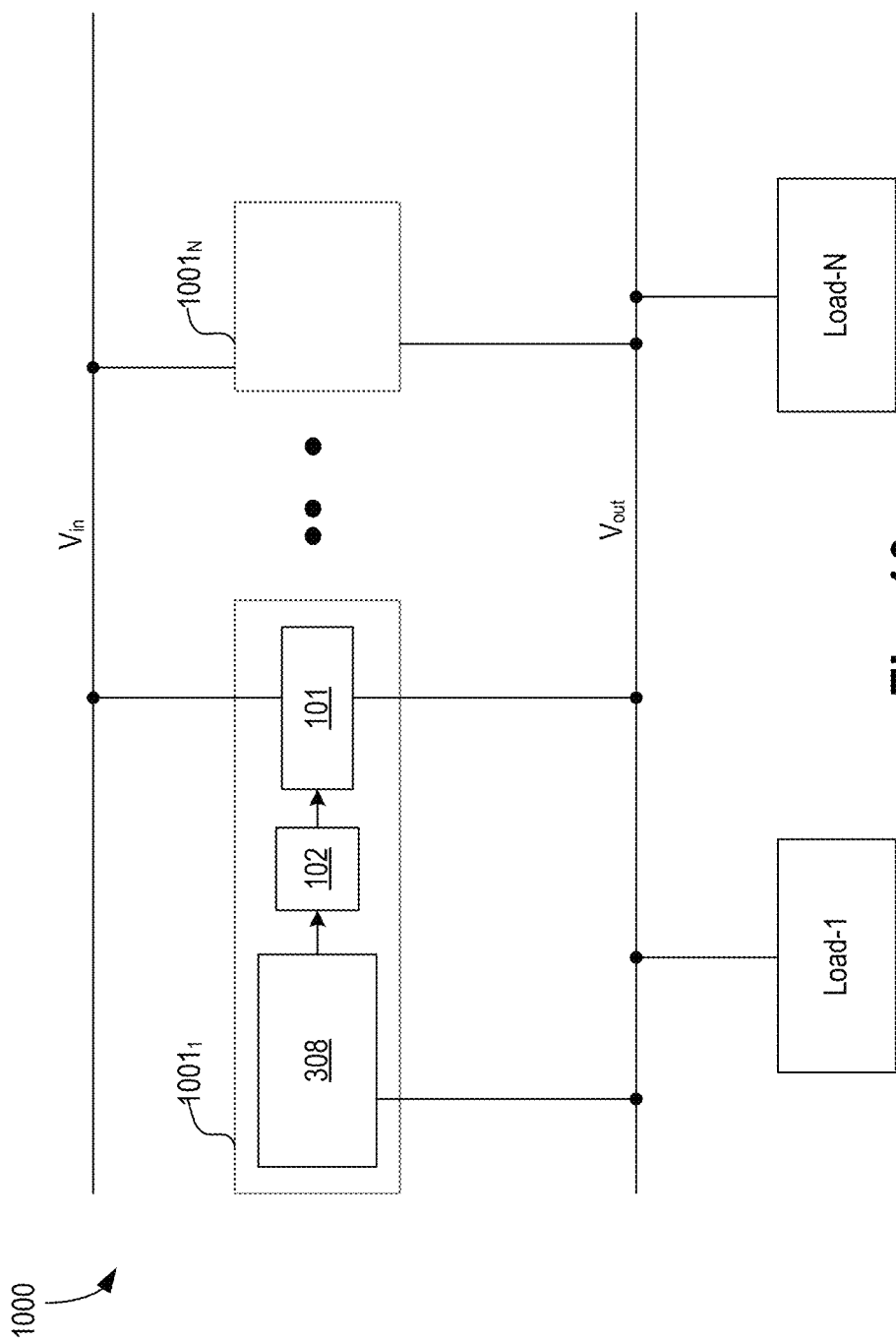
FIG. 10 illustrates a distributive network of apparatuses of FIGS. 3A-B to provide regulated power supply to one or more logic blocks, in accordance with some embodiments.

FIG. 10 illustrates a distributive network 1000 of apparatuses of FIGS. 3A-B to provide regulated power supply to one or more logic blocks, in accordance with some embodiments. In some embodiments, network 1000 comprises 'N' number of distributed LDOs $1001_{1-N}$ that are based on apparatus 300, 320 of FIGS. 3A-B. These distributed LDOs can maintain various loading conditions on Load-1 through Load-N. While the embodiment of FIG. 10 illustrates separate PD controllers for each LDO, in some embodiments, PD controller 308 is shared among multiple LDOs. Even though the example of LDO shown with reference to various embodiments is for supplying leakage current during low-power state, the embodiments can also be used to supply dynamic current during active operation using the methodology of proportional-derivative control (PD). Moreover, due to all digital implementation, for larger power-domains, the PD LDO scheme can be replicated N times thus guaranteeing scalability of the design, in accordance with some embodiments. In some embodiments, the PD overhead is kept to a minimum so that replication can be achieved without significant area and/or power penalty.

Figure 11:
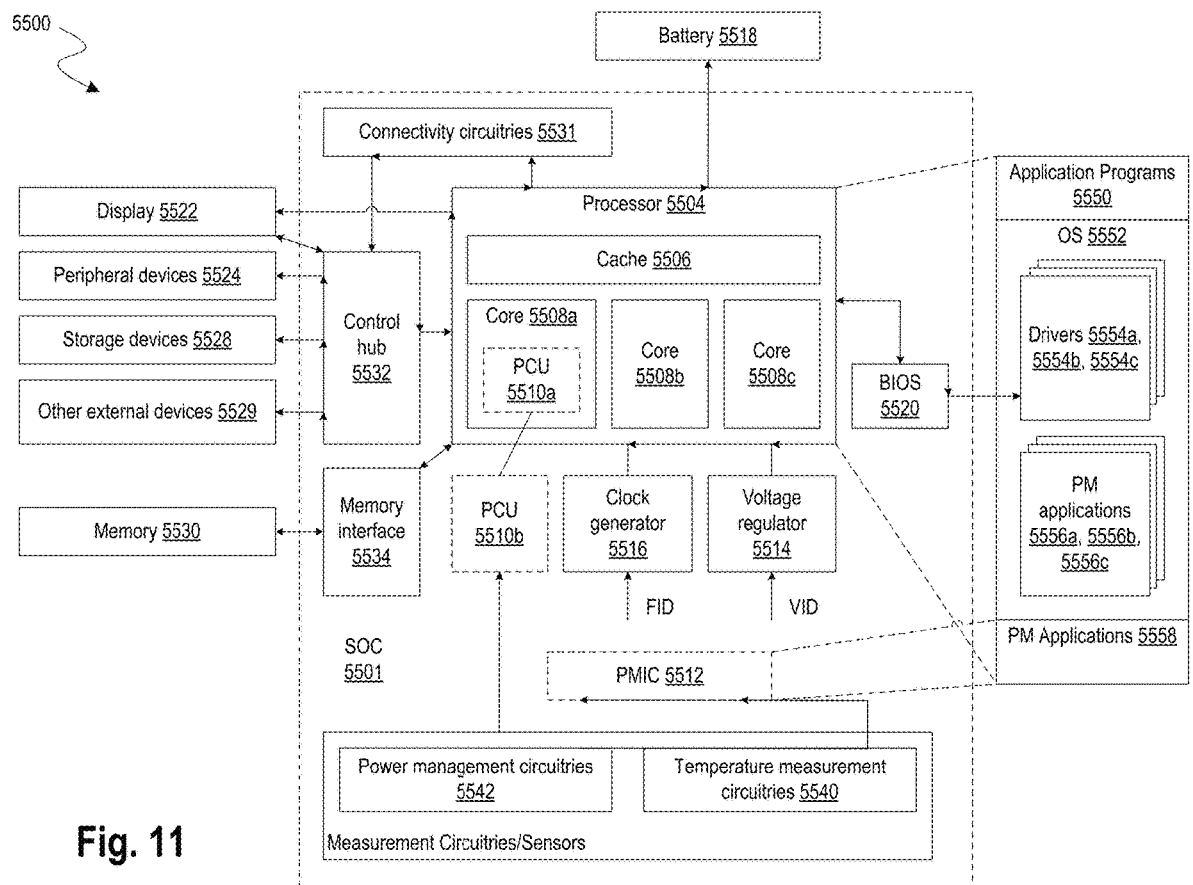
FIG. 11 illustrates a smart device or a computer system or a SoC (System-on-Chip) having an all-digital PD controller for retention clamp and adaptive wake-up modes, in accordance with some embodiments.

FIG. 11 illustrates a smart device or a computer system or a SoC (System-on-Chip) having an all-digital PD controller for retention clamp and adaptive wake-up modes, in accordance with some embodiments. In some embodiments, device 5500 represents an appropriate computing device, such as a computing tablet, a mobile phone or smart-phone, a laptop, a desktop, an Internet-of-Things (IOT) device, a server, a wearable device, a set-top box, a wireless-enabled e-reader, or the like. It will be understood that certain components are shown generally, and not all components of such a device are shown in device 5500.

In some embodiments, device 5500 represents an appropriate computing device, such as a computing tablet, a mobile phone or smart-phone, a laptop, a desktop, an Internet-of-Things (IOT) device, a server, a wearable device, a set-top box, a wireless-enabled e-reader, or the like. It will be understood that certain components are shown generally, and not all components of such a device are shown in device 5500.

In an example, the device 5500 comprises an SoC (System-on-Chip) 5501. An example boundary of the SoC 5501 is illustrated using dotted lines in FIG. 11, with some example components being illustrated to be included within SoC 5501—however, SoC 5501 may include any appropriate components of device 5500.

In some embodiments, device 5500 includes processor 5504. Processor 5504 can include one or more physical devices, such as microprocessors, application processors, microcontrollers, programmable logic devices, processing cores, or other processing implementations such as disaggregated combinations of multiple compute, graphics, accelerator, I/O and/or other processing chips. The processing operations performed by processor 5504 include the execution of an operating platform or operating system on which applications and/or device functions are executed. The processing operations include operations related to I/O (input/output) with a human user or with other devices, operations related to power management, operations related to connecting computing device 5500 to another device, and/or the like. The processing operations may also include operations related to audio I/O and/or display I/O.

In some embodiments, processor 5504 includes multiple processing cores (also referred to as cores) 5508a, 5508b, 5508c. Although merely three cores 5508a, 5508b, 5508c are illustrated in FIG. 11, processor 5504 may include any other appropriate number of processing cores, e.g., tens, or even hundreds of processing cores. Processor cores 5508a, 5508b, 5508c may be implemented on a single integrated circuit (IC) chip. Moreover, the chip may include one or more shared and/or private caches, buses or interconnections, graphics and/or memory controllers, or other components.

In some embodiments, processor 5504 includes cache 5506. In an example, sections of cache 5506 may be dedicated to individual cores 5508 (e.g., a first section of cache 5506 dedicated to core 5508a, a second section of cache 5506 dedicated to core 5508b, and so on). In an example, one or more sections of cache 5506 may be shared among two or more of cores 5508. Cache 5506 may be split in different levels, e.g., level 1 (L1) cache, level 2 (L2) cache, level 3 (L3) cache, etc.

In some embodiments, processor core 5504 may include a fetch unit to fetch instructions (including instructions with conditional branches) for execution by the core 5504. The instructions may be fetched from any storage devices such as the memory 5530. Processor core 5504 may also include a decode unit to decode the fetched instruction. For example, the decode unit may decode the fetched instruction into a plurality of micro-operations. Processor core 5504 may include a schedule unit to perform various operations associated with storing decoded instructions. For example, the schedule unit may hold data from the decode unit until the instructions are ready for dispatch, e.g., until all source values of a decoded instruction become available. In one embodiment, the schedule unit may schedule and/or issue (or dispatch) decoded instructions to an execution unit for execution.

The execution unit may execute the dispatched instructions after they are decoded (e.g., by the decode unit) and dispatched (e.g., by the schedule unit). In an embodiment, the execution unit may include more than one execution unit (such as an imaging computational unit, a graphics computational unit, a general-purpose computational unit, etc.). The execution unit may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit.

Further, execution unit may execute instructions out-of-order. Hence, processor core 5504 may be an out-of-order processor core in one embodiment. Processor core 5504 may also include a retirement unit. The retirement unit may retire executed instructions after they are committed. In an embodiment, retirement of the executed instructions may result in processor state being committed from the execution of the instructions, physical registers used by the instructions being de-allocated, etc. Processor core 5504 may also include a bus unit to enable communication between components of processor core 5504 and other components via one or more buses. Processor core 5504 may also include one or more registers to store data accessed by various components of the core 5504 (such as values related to assigned app priorities and/or sub-system states (modes) association.

In some embodiments, device 5500 comprises connectivity circuitries 5531. For example, connectivity circuitries 5531 includes hardware devices (e.g., wireless and/or wired connectors and communication hardware) and/or software components (e.g., drivers, protocol stacks), e.g., to enable device 5500 to communicate with external devices. Device 5500 may be separate from the external devices, such as other computing devices, wireless access points or base stations, etc.

In an example, connectivity circuitries 5531 may include multiple different types of connectivity. To generalize, the connectivity circuitries 5531 may include cellular connectivity circuitries, wireless connectivity circuitries, etc. Cellular connectivity circuitries of connectivity circuitries 5531 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. Wireless connectivity circuitries (or wireless interface) of the connectivity circuitries 5531 refers to wireless connectivity that is not cellular, and can include personal area networks (such as Bluetooth, Near Field, etc.), local area networks (such as Wi-Fi), and/or wide area networks (such as WiMax), and/or other wireless communication. In an example, connectivity circuitries 5531 may include a network interface, such as a wired or wireless interface, e.g., so that a system embodiment may be incorporated into a wireless device, for example, a cell phone or personal digital assistant.

In some embodiments, device 5500 comprises control hub 5532, which represents hardware devices and/or software components related to interaction with one or more I/O devices. For example, processor 5504 may communicate with one or more of display 5522, one or more peripheral devices 5524, storage devices 5528, one or more other external devices 5529, etc., via control hub 5532. Control hub 5532 may be a chipset, a Platform Control Hub (PCH), and/or the like.

For example, control hub 5532 illustrates one or more connection points for additional devices that connect to device 5500, e.g., through which a user might interact with the system. For example, devices (e.g., devices 5529) that can be attached to device 5500 include microphone devices, speaker or stereo systems, audio devices, video systems or other display devices, keyboard or keypad devices, or other I/O devices for use with specific applications such as card readers or other devices.

As mentioned above, control hub 5532 can interact with audio devices, display 5522, etc. For example, input through a microphone or other audio device can provide input or commands for one or more applications or functions of device 5500. Additionally, audio output can be provided instead of, or in addition to display output. In another example, if display 5522 includes a touch screen, display 5522 also acts as an input device, which can be at least partially managed by control hub 5532. There can also be additional buttons or switches on computing device 5500 to provide I/O functions managed by control hub 5532. In one embodiment, control hub 5532 manages devices such as accelerometers, cameras, light sensors or other environmental sensors, or other hardware that can be included in device 5500. The input can be part of direct user interaction, as well as providing environmental input to the system to influence its operations (such as filtering for noise, adjusting displays for brightness detection, applying a flash for a camera, or other features).

In some embodiments, control hub 5532 may couple to various devices using any appropriate communication protocol, e.g., PCIe (Peripheral Component Interconnect Express), USB (Universal Serial Bus), Thunderbolt, High Definition Multimedia Interface (HDMI), Firewire, etc.

In some embodiments, display 5522 represents hardware (e.g., display devices) and software (e.g., drivers) components that provide a visual and/or tactile display for a user to interact with device 5500. Display 5522 may include a display interface, a display screen, and/or hardware device used to provide a display to a user. In some embodiments, display 5522 includes a touch screen (or touch pad) device that provides both output and input to a user. In an example, display 5522 may communicate directly with the processor 5504. Display 5522 can be one or more of an internal display device, as in a mobile electronic device or a laptop device or an external display device attached via a display interface (e.g., DisplayPort, etc.). In one embodiment display 5522 can be a head mounted display (HMD) such as a stereoscopic display device for use in virtual reality (VR) applications or augmented reality (AR) applications.

In some embodiments, and although not illustrated in the figure, in addition to (or instead of) processor 5504, device 5500 may include Graphics Processing Unit (GPU) comprising one or more graphics processing cores, which may control one or more aspects of displaying contents on display 5522.

Control hub 5532 (or platform controller hub) may include hardware interfaces and connectors, as well as software components (e.g., drivers, protocol stacks) to make peripheral connections, e.g., to peripheral devices 5524.

It will be understood that device 5500 could both be a peripheral device to other computing devices, as well as have peripheral devices connected to it. Device 5500 may have a "docking" connector to connect to other computing devices for purposes such as managing (e.g., downloading and/or uploading, changing, synchronizing) content on device 5500. Additionally, a docking connector can allow device 5500 to connect to certain peripherals that allow computing device 5500 to control content output, for example, to audiovisual or other systems.

In addition to a proprietary docking connector or other proprietary connection hardware, device 5500 can make peripheral connections via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, connectivity circuitries 5531 may be coupled to control hub 5532, e.g., in addition to, or instead of, being coupled directly to the processor 5504. In some embodiments, display 5522 may be coupled to control hub 5532, e.g., in addition to, or instead of, being coupled directly to processor 5504.

In some embodiments, device 5500 comprises memory 5530 coupled to processor 5504 via memory interface 5534. Memory 5530 includes memory devices for storing information in device 5500.

In some embodiments, memory 5530 includes apparatus to maintain stable clocking as described with reference to various embodiments. Memory can include nonvolatile (state does not change if power to the memory device is interrupted) and/or volatile (state is indeterminate if power to the memory device is interrupted) memory devices. Memory device 5530 can be a dynamic random-access memory (DRAM) device, a static random-access memory (SRAM) device, flash memory device, phase-change memory device, or some other memory device having suitable performance to serve as process memory. In one embodiment, memory 5530 can operate as system memory for device 5500, to store data and instructions for use when the one or more processors 5504 executes an application or process. Memory 5530 can store application data, user data, music, photos, documents, or other data, as well as system data (whether long-term or temporary) related to the execution of the applications and functions of device 5500.

Elements of various embodiments and examples are also provided as a machine-readable medium (e.g., memory 5530) for storing the computer-executable instructions (e.g., instructions to implement any other processes discussed herein). The machine-readable medium (e.g., memory 5530) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, device 5500 comprises temperature measurement circuitries 5540, e.g., for measuring temperature of various components of device 5500. In an example, temperature measurement circuitries 5540 may be embedded, or coupled or attached to various components, whose temperature are to be measured and monitored. For example, temperature measurement circuitries 5540 may measure temperature of (or within) one or more of cores 5508a, 5508b, 5508c, voltage regulator 5514, memory 5530, a mother-board of SoC 5501, and/or any appropriate component of device 5500. In some embodiments, temperature measurement circuitries 5540 include a low power hybrid reverse (LPHR) bandgap reference (BGR) and digital temperature sensor (DTS), which utilizes subthreshold metal oxide semiconductor (MOS) transistor and the PNP parasitic Bi-polar Junction Transistor (BJT) device to form a reverse BGR that serves as the base for configurable BGR or DTS operating modes. The LPHR architecture uses low-cost MOS transistors and the standard parasitic PNP device. Based on a reverse bandgap voltage, the LPHR can work as a configurable BGR. By comparing the configurable BGR with the scaled base-emitter voltage, the circuit can also perform as a DTS with a linear transfer function with single-temperature trim for high accuracy.

In some embodiments, device 5500 comprises power measurement circuitries 5542, e.g., for measuring power consumed by one or more components of the device 5500. In an example, in addition to, or instead of, measuring power, the power measurement circuitries 5542 may measure voltage and/or current. In an example, the power measurement circuitries 5542 may be embedded, or coupled or attached to various components, whose power, voltage, and/or current consumption are to be measured and monitored. For example, power measurement circuitries 5542 may measure power, current and/or voltage supplied by one or more voltage regulators 5514, power supplied to SoC 5501, power supplied to device 5500, power consumed by processor 5504 (or any other component) of device 5500, etc.

In some embodiments, device 5500 comprises one or more voltage regulator circuitries, generally referred to as voltage regulator (VR) 5514. VR 5514 generates signals at appropriate voltage levels, which may be supplied to operate any appropriate components of the device 5500. Merely as an example, VR 5514 is illustrated to be supplying signals to processor 5504 of device 5500. In some embodiments, VR 5514 receives one or more Voltage Identification (VID) signals, and generates the voltage signal at an appropriate level, based on the VID signals. Various type of VRs may be utilized for the VR 5514. For example, VR 5514 may include a "buck" VR, "boost" VR, a combination of buck and boost VRs, low dropout (LDO) regulators, switching DC-DC regulators, constant-on-time controller-based DC-DC regulator, etc. Buck VR is generally used in power delivery applications in which an input voltage needs to be transformed to an output voltage in a ratio that is smaller than unity. Boost VR is generally used in power delivery applications in which an input voltage needs to be transformed to an output voltage in a ratio that is larger than unity. In some embodiments, each processor core has its own VR, which is controlled by PCU 5510a/b and/or PMIC 5512. In some embodiments, each core has a network of distributed LDOs to provide efficient control for power management. The LDOs can be digital, analog, or a combination of digital or analog LDOs. In some embodiments, VR 5514 includes current tracking apparatus to measure current through power supply rail(s).

In some embodiments, VR 5514 includes a digital control scheme to manage states of a proportional-integral-derivative (PID) filter (also known as a digital Type-III compensator). The digital control scheme controls the integrator of the PID filter to implement non-linear control of saturating the duty cycle during which the proportional and derivative terms of the PID are set to 0 while the integrator and its internal states (previous values or memory) is set to a duty cycle that is the sum of the current nominal duty cycle plus a deltaD. The deltaD is the maximum duty cycle increment that is used to regulate a voltage regulator from ICCmin to ICCmax and is a configuration register that can be set post silicon. A state machine moves from a non-linear all ON state (which brings the output voltage Vout back to a regulation window) to an open loop duty cycle which maintains the output voltage slightly higher than the required reference voltage Vref. After a certain period in this state of open loop at the commanded duty cycle, the state machine then ramps down the open loop duty cycle value until the output voltage is close to the Vref commanded. As such, output chatter on the output supply from VR 5514 is completely eliminated (or substantially eliminated) and there is merely a single undershoot transition which could lead to a guaranteed Vmin based on a comparator delay and the di/dt of the load with the available output decoupling capacitance.

In some embodiments, VR 5514 includes a separate self-start controller, which is functional without fuse and/or trim information. The self-start controller protects VR 5514 against large inrush currents and voltage overshoots, while being capable of following a variable VID (voltage identification) reference ramp imposed by the system. In some embodiments, the self-start controller uses a relaxation oscillator built into the controller to set the switching frequency of the buck converter. The oscillator can be initialized using either a clock or current reference to be close to a desired operating frequency. The output of VR 5514 is coupled weakly to the oscillator to set the duty cycle for closed loop operation. The controller is naturally biased such that the output voltage is always slightly higher than the set point, eliminating the need for any process, voltage, and/or temperature (PVT) imposed trims.

In some embodiments, device 5500 comprises one or more clock generator circuitries, generally referred to as clock generator 5516. Clock generator 5516 generates clock signals at appropriate frequency levels, which may be supplied to any appropriate components of device 5500. Merely as an example, clock generator 5516 is illustrated to be supplying clock signals to processor 5504 of device 5500. In some embodiments, clock generator 5516 receives one or more Frequency Identification (FID) signals, and generates the clock signals at an appropriate frequency, based on the FID signals.

In some embodiments, device 5500 comprises battery 5518 supplying power to various components of device 5500. Merely as an example, battery 5518 is illustrated to be supplying power to processor 5504. Although not illustrated in the figures, device 5500 may comprise a charging circuitry, e.g., to recharge the battery, based on Alternating Current (AC) power supply received from an AC adapter.

In some embodiments, battery 5518 periodically checks an actual battery capacity or energy with charge to a preset voltage (e.g., 4.1 V). The battery then decides of the battery capacity or energy. If the capacity or energy is insufficient, then an apparatus in or associated with the battery slightly increases charging voltage to a point where the capacity is sufficient (e.g. from 4.1 V to 4.11 V). The process of periodically checking and slightly increase charging voltage is performed until charging voltage reaches specification limit (e.g., 4.2 V). The scheme described herein has benefits such as battery longevity can be extended, risk of insufficient energy reserve can be reduced, burst power can be used as long as possible, and/or even higher burst power can be used.

In some embodiments, the charging circuitry (e.g., 5518) comprises a buck-boost converter. This buck-boost converter comprises DrMOS or DrGaN devices used in place of half-bridges for traditional buck-boost converters. Various embodiments here are described with reference to DrMOS. However, the embodiments are applicable to DrGaN. The DrMOS devices allow for better efficiency in power conversion due to reduced parasitic and optimized MOSFET packaging. Since the dead-time management is internal to the DrMOS, the dead-time management is more accurate than for traditional buck-boost converters leading to higher efficiency in conversion. Higher frequency of operation allows for smaller inductor size, which in turn reduces the z-height of the charger comprising the DrMOS based buck-boost converter. The buck-boost converter of various embodiments comprises dual-folded bootstrap for DrMOS devices. In some embodiments, in addition to the traditional bootstrap capacitors, folded bootstrap capacitors are added that cross-couple inductor nodes to the two sets of DrMOS switches.

In some embodiments, device 5500 comprises Power Control Unit (PCU) 5510 (also referred to as Power Management Unit (PMU), Power Management Controller (PMC), Power Unit (p-unit), etc.). In an example, some sections of PCU 5510 may be implemented by one or more processing cores 5508, and these sections of PCU 5510 are symbolically illustrated using a dotted box and labelled PCU 5510*a*. In an example, some other sections of PCU 5510 may be implemented outside the processing cores 5508, and these sections of PCU 5510 are symbolically illustrated using a dotted box and labelled as PCU 5510*b*. PCU 5510 may implement various power management operations for device 5500. PCU 5510 may include hardware interfaces, hardware circuitries, connectors, registers, etc., as well as software components (e.g., drivers, protocol stacks), to implement various power management operations for device 5500.

In various embodiments, PCU or PMU 5510 is organized in a hierarchical manner forming a hierarchical power management (HPM). HPM of various embodiments builds a capability and infrastructure that allows for package level management for the platform, while still catering to islands of autonomy that might exist across the constituent die in the package. HPM does not assume a pre-determined mapping of physical partitions to domains. An HPM domain can be aligned with a function integrated inside a dielet, to a dielet boundary, to one or more dielets, to a companion die, or even a discrete CXL device. HPM addresses integration of multiple instances of the same die, mixed with proprietary functions or 3rd party functions integrated on the same die or separate die, and even accelerators connected via CXL (e.g., Flexbus) that may be inside the package, or in a discrete form factor.

HPM enables designers to meet the goals of scalability, modularity, and late binding. HPM also allows PMU functions that may already exist on other dice to be leveraged, instead of being disabled in the flat scheme. HPM enables management of any arbitrary collection of functions independent of their level of integration. HPM of various embodiments is scalable, modular, works with symmetric multi-chip processors (MCPs), and works with asymmetric MCPs. For example, HPM does not need a signal PM controller and package infrastructure to grow beyond reasonable scaling limits. HPM enables late addition of a die in a package without the need for change in the base die infrastructure. HPM addresses the need of disaggregated solutions having dies of different process technology nodes coupled in a single package. HPM also addresses the needs of companion die integration solutions—on and off package.

In various embodiments, each die (or dielet) includes a power management unit (PMU) or p-unit. For example, processor dies can have a supervisor p-unit, supervisee p-unit, or a dual role supervisor/supervisee p-unit. In some embodiments, an I/O die has its own dual role p-unit such as supervisor and/or supervisee p-unit. The p-units in each die can be instances of a generic p-unit. In one such example, all p-units have the same capability and circuits, but are configured (dynamically or statically) to take a role of a supervisor, supervisee, and/or both. In some embodiments, the p-units for compute dies are instances of a compute p-unit while p-units for IO dies are instances of an IO p-unit different from the compute p-unit. Depending on the role, p-unit acquires specific responsibilities to manage power of the multichip module and/or computing platform. While various p-units are described for dies in a multichip module or system-on-chip, a p-unit can also be part of an external device such as I/O device.

Here, the various p-units do not have to be the same. The HPM architecture can operate very different types of p-units. One common feature for the p-units is that they are expected to receive HPM messages and are expected to be able to comprehend them. In some embodiments, the p-unit of IO dies may be different than the p-unit of the compute dies. For example, the number of register instances of each class of register in the IO p-unit is different than those in the p-units of the compute dies. An IO die has the capability of being an HPM supervisor for CXL connected devices, but compute die may not need to have that capability. The IO and computes dice also have different firmware flows and possibly different firmware images. These are choices that an implementation can make. An HPM architecture can choose to have one superset firmware image and selectively execute flows that are relevant to the die type the firmware is associated with. Alternatively, there can be a customer firmware for each p-unit type; it can allow for more streamlined sizing of the firmware storage requirements for each p-unit type.

The p-unit in each die can be configured as a supervisor p-unit, supervisee p-unit or with a dual role of supervisor/supervisee. As such, p-units can perform roles of supervisor or supervisee for various domains. In various embodiments, each instance of p-unit is capable of autonomously managing local dedicated resources and contains structures to aggregate data and communicate between instances to enable shared resource management by the instance configured as the shared resource supervisor. A message and wire-based infrastructure is provided that can be duplicated and configured to facilitate management and flows between multiple p-units.

In some embodiments, power and thermal thresholds are communicated by a supervisor p-unit to supervisee p-units. For example, a supervisor p-unit learns of the workload (present and future) of each die, power measurements of each die, and other parameters (e.g., platform level power boundaries) and determines new power limits for each die. These power limits are then communicated by supervisor p-units to the supervisee p-units via one or more interconnects and fabrics. In some embodiments, a fabric indicates a group of fabrics and interconnect including a first fabric, a second fabric, and a fast response interconnect. In some embodiments, the first fabric is used for common communication between a supervisor p-unit and a supervisee p-unit. These common communications include change in voltage, frequency, and/or power state of a die which is planned based on a number of factors (e.g., future workload, user behavior, etc.). In some embodiments, the second fabric is used for higher priority communication between supervisor p-unit and supervisee p-unit. Example of higher priority communication include a message to throttle because of a possible thermal runaway condition, reliability issue, etc. In some embodiments, a fast response interconnect is used for communicating fast or hard throttle of all dies. In this case, a supervisor p-unit may send a fast throttle message to all other p-units, for example. In some embodiments, a fast response interconnect is a legacy interconnect whose function can be performed by the second fabric.

The HPM architecture of various embodiments enables scalability, modularity, and late binding of symmetric and/or asymmetric dies. Here, symmetric dies are dies of same size, type, and/or function, while asymmetric dies are dies of different size, type, and/or function. Hierarchical approach also allows PMU functions that may already exist on other dice to be leveraged, instead of being disabled in the traditional flat power management scheme. HPM does not assume a pre-determined mapping of physical partitions to domains. An HPM domain can be aligned with a function integrated inside a dielet, to a dielet boundary, to one or more dielets, to a companion die, or even a discrete CXL device. HPM enables management of any arbitrary collection of functions independent of their level of integration. In some embodiments, a p-unit is declared a supervisor p-unit based on one or more factors. These factors include memory size, physical constraints (e.g., number of pin-outs), and locations of sensors (e.g., temperature, power consumption, etc.) to determine physical limits of the processor.

The HPM architecture of various embodiments, provides a means to scale power management so that a single p-unit instance does not need to be aware of the entire processor. This enables power management at a smaller granularity and improves response times and effectiveness. Hierarchical structure maintains a monolithic view to the user. For example, at an operating system (OS) level, HPM architecture gives the OS a single PMU view even though the PMU is physically distributed in one or more supervisor-supervisee configurations.

In some embodiments, the HPM architecture is centralized where one supervisor controls all supervisees. In some embodiments, the HPM architecture is decentralized, wherein various p-units in various dies control overall power management by peer-to-peer communication. In some embodiments, the HPM architecture is distributed where there are different supervisors for different domains. One example of a distributed architecture is a tree-like architecture.

In some embodiments, device 5500 comprises Power Management Integrated Circuit (PMIC) 5512, e.g., to implement various power management operations for device 5500. In some embodiments, PMIC 5512 is a Reconfigurable Power Management ICs (RPMICs) and/or an IMVP (Intel® Mobile Voltage Positioning). In an example, the PMIC is within an IC die separate from processor 5504. The may implement various power management operations for device 5500. PMIC 5512 may include hardware interfaces, hardware circuitries, connectors, registers, etc., as well as software components (e.g., drivers, protocol stacks), to implement various power management operations for device 5500.

In an example, device 5500 comprises one or both PCU 5510 or PMIC 5512. In an example, any one of PCU 5510 or PMIC 5512 may be absent in device 5500, and hence, these components are illustrated using dotted lines.

Various power management operations of device 5500 may be performed by PCU 5510, by PMIC 5512, or by a combination of PCU 5510 and PMIC 5512. For example, PCU 5510 and/or PMIC 5512 may select a power state (e.g., P-state) for various components of device 5500. For example, PCU 5510 and/or PMIC 5512 may select a power state (e.g., in accordance with the ACPI (Advanced Configuration and Power Interface) specification) for various components of device 5500. Merely as an example, PCU 5510 and/or PMIC 5512 may cause various components of the device 5500 to transition to a sleep state, to an active state, to an appropriate C state (e.g., C0 state, or another appropriate C state, in accordance with the ACPI specification), etc. In an example, PCU 5510 and/or PMIC 5512 may control a voltage output by VR 5514 and/or a frequency of a clock signal output by the clock generator, e.g., by outputting the VID signal and/or the FID signal, respectively. In an example, PCU 5510 and/or PMIC 5512 may control battery power usage, charging of battery 5518, and features related to power saving operation.

The clock generator 5516 can comprise a phase locked loop (PLL), frequency locked loop (FLL), or any suitable clock source. In some embodiments, each core of processor 5504 has its own clock source. As such, each core can operate at a frequency independent of the frequency of operation of the other core. In some embodiments, PCU 5510 and/or PMIC 5512 performs adaptive or dynamic frequency scaling or adjustment. For example, clock frequency of a processor core can be increased if the core is not operating at its maximum power consumption threshold or limit. In some embodiments, PCU 5510 and/or PMIC 5512 determines the operating condition of each core of a processor, and opportunistically adjusts frequency and/or power supply voltage of that core without the core clocking source (e.g., PLL of that core) losing lock when the PCU 5510 and/or PMIC 5512 determines that the core is operating below a target performance level. For example, if a core is drawing current from a power supply rail less than a total current allocated for that core or processor 5504, then PCU 5510 and/or PMIC 5512 can temporality increase the power draw for that core or processor 5504 (e.g., by increasing clock frequency and/or power supply voltage level) so that the core or processor 5504 can perform at higher performance level. As such, voltage and/or frequency can be increased temporality for processor 5504 without violating product reliability.

In an example, PCU 5510 and/or PMIC 5512 may perform power management operations, e.g., based at least in part on receiving measurements from power measurement circuitries 5542, temperature measurement circuitries 5540, charge level of battery 5518, and/or any other appropriate information that may be used for power management. To that end, PMIC 5512 is communicatively coupled to one or more sensors to sense/detect various values/variations in one or more factors having an effect on power/thermal behavior of the system/platform. Examples of the one or more factors include electrical current, voltage droop, temperature, operating frequency, operating voltage, power consumption, inter-core communication activity, etc. One or more of these sensors may be provided in physical proximity (and/or thermal contact/coupling) with one or more components or logic/IP blocks of a computing system. Additionally, sensor(s) may be directly coupled to PCU 5510 and/or PMIC 5512 in at least one embodiment to allow PCU 5510 and/or PMIC 5512 to manage processor core energy at least in part based on value(s) detected by one or more of the sensors.

Also illustrated is an example software stack of device 5500 (although not all elements of the software stack are illustrated). Merely as an example, processors 5504 may execute application programs 5550, Operating System 5552, one or more Power Management (PM) specific application programs (e.g., generically referred to as PM applications 5558), and/or the like. PM applications 5558 may also be executed by the PCU 5510 and/or PMIC 5512. OS 5552 may also include one or more PM applications 5556*a*, 5556*b*, 5556*c*. The OS 5552 may also include various drivers 5554*a*, 5554*b*, 5554*c*, etc., some of which may be specific for power management purposes. In some embodiments, device 5500 may further comprise a Basic Input/output System (BIOS) 5520. BIOS 5520 may communicate with OS 5552 (e.g., via one or more drivers 5554), communicate with processors 5504, etc.

For example, one or more of PM applications 5558, 5556, drivers 5554, BIOS 5520, etc. may be used to implement power management specific tasks, e.g., to control voltage and/or frequency of various components of device 5500, to control wake-up state, sleep state, and/or any other appropriate power state of various components of device 5500, control battery power usage, charging of the battery 5518, features related to power saving operation, etc.

In some embodiments, battery 5518 is a Li-metal battery with a pressure chamber to allow uniform pressure on a battery. The pressure chamber is supported by metal plates (such as pressure equalization plate) used to give uniform pressure to the battery. The pressure chamber may include pressured gas, elastic material, spring plate, etc. The outer skin of the pressure chamber is free to bow, restrained at its edges by (metal) skin, but still exerts a uniform pressure on the plate that is compressing the battery cell. The pressure chamber gives uniform pressure to battery, which is used to enable high-energy density battery with, for example, 20% more battery life.

In some embodiments, battery 5518 includes hybrid technologies. For example, a mix of high energy density charge (e.g., Li-Ion batteries) carrying device(s) and low energy density charge carrying devices (e.g., supercapacitor) are used as batteries or storage devices. In some embodiments, a controller (e.g., hardware, software, or a combination of them) is used analyze peak power patterns and minimizes the impact to overall lifespan of high energy density charge carrying device-based battery cells while maximizing service time for peak power shaving feature. The controller may be part of battery 5518 or part of p-unit 5510*b*.

In some embodiments, pCode executing on PCU 5510*a/b* has a capability to enable extra compute and telemetries resources for the runtime support of the pCode. Here pCode refers to a firmware executed by PCU 5510*a/b* to manage performance of the SoC 5501. For example, pCode may set frequencies and appropriate voltages for the processor. Part of the pCode are accessible via OS 5552. In various embodiments, mechanisms and methods are provided that dynamically change an Energy Performance Preference (EPP) value based on workloads, user behavior, and/or system conditions. There may be a well-defined interface between OS 5552 and the pCode. The interface may allow or facilitate the software configuration of several parameters and/or may provide hints to the pCode. As an example, an EPP parameter may inform a pCode algorithm as to whether performance or battery life is more important.

This support may be done as well by the OS 5552 by including machine-learning support as part of OS 5552 and either tuning the EPP value that the OS hints to the hardware (e.g., various components of SoC 5501) by machine-learning prediction, or by delivering the machine-learning prediction to the pCode in a manner similar to that done by a Dynamic Tuning Technology (DTT) driver. In this model, OS 5552 may have visibility to the same set of telemetries as are available to a DTT. As a result of a DTT machine-learning hint setting, pCode may tune its internal algorithms to achieve optimal power and performance results following the machine-learning prediction of activation type. The pCode as example may increase the responsibility for the processor utilization change to enable fast response for user activity, or may increase the bias for energy saving either by reducing the responsibility for the processor utilization or by saving more power and increasing the performance lost by tuning the energy saving optimization. This approach may facilitate saving more battery life in case the types of activities enabled lose some performance level over what the system can enable. The pCode may include an algorithm for dynamic EPP that may take the two inputs, one from OS 5552 and the other from software such as DTT, and may selectively choose to provide higher performance and/or responsiveness. As part of this method, the pCode may enable in the DTT an option to tune its reaction for the DTT for different types of activity.

In some embodiments, pCode improves the performance of the SoC in battery mode. In some embodiments, pCode allows drastically higher SoC peak power limit levels (and thus higher Turbo performance) in battery mode. In some embodiments, pCode implements power throttling and is part of Intel's Dynamic Tuning Technology (DTT). In various embodiments, the peak power limit is referred to PL4. However, the embodiments are applicable to other peak power limits. In some embodiments, pCode sets the Vth threshold voltage (the voltage level at which the platform will throttle the SoC) in such a way as to prevent the system from unexpected shutdown (or black screening). In some embodiments, pCode calculates the Psoc,pk SoC Peak Power Limit (e.g., PL4), according to the threshold voltage (Vth). These are two dependent parameters, if one is set, the other can be calculated. pCode is used to optimally set one parameter (Vth) based on the system parameters, and the history of the operation. In some embodiments, pCode provides a scheme to dynamically calculate the throttling level (Psoc,th) based on the available battery power (which changes slowly) and set the SoC throttling peak power (Psoc,th). In some embodiments, pCode decides the frequencies and voltages based on Psoc,th. In this case, throttling events have less negative effect on the SoC performance Various embodiments provide a scheme which allows maximum performance (Pmax) framework to operate.

In some embodiments, VR 5514 includes a current sensor to sense and/or measure current through a high-side switch of VR 5514. In some embodiments the current sensor uses an amplifier with capacitively coupled inputs in feedback to sense the input offset of the amplifier, which can be compensated for during measurement. In some embodiments, the amplifier with capacitively coupled inputs in feedback is used to operate the amplifier in a region where the input common-mode specifications are relaxed, so that the feedback loop gain and/or bandwidth is higher. In some embodiments, the amplifier with capacitively coupled inputs in feedback is used to operate the sensor from the converter input voltage by employing high-PSRR (power supply rejection ratio) regulators to create a local, clean supply voltage, causing less disruption to the power grid in the switch area. In some embodiments, a variant of the design can be used to sample the difference between the input voltage and the controller supply, and recreate that between the drain voltages of the power and replica switches. This allows the sensor to not be exposed to the power supply voltage. In some embodiments, the amplifier with capacitively coupled inputs in feedback is used to compensate for power delivery network related (PDN-related) changes in the input voltage during current sensing.

Some embodiments use three components to adjust the peak power of SoC 5501 based on the states of a USB TYPE-C device 5529. These components include OS Peak Power Manager (part of OS 5552), USB TYPE-C Connector Manager (part of OS 5552), and USB TYPE-C Protocol Device Driver (e.g., one of drivers 5554*a*, 5554*b*, 5554*c*). In some embodiments, the USB TYPE-C Connector Manager sends a synchronous request to the OS Peak Power Manager when a USB TYPE-C power sink device is attached or detached from SoC 5501, and the USB TYPE-C Protocol Device Driver sends a synchronous request to the Peak Power Manager when the power sink transitions device state. In some embodiments, the Peak Power Manager takes power budget from the CPU when the USB TYPE-C connector is attached to a power sink and is active (e.g., high power device state). In some embodiments, the Peak Power Manager gives back the power budget to the CPU for performance when the USB TYPE-C connector is either detached or the attached and power sink device is idle (lowest device state).

In some embodiments, logic is provided to dynamically pick the best operating processing core for BIOS power-up flows and sleep exit flows (e.g., S3, S4, and/or S5). The selection of the bootstrap processor (BSP) is moved to an early power-up time instead of a fixed hardware selection at any time. For maximum boot performance, the logic selects the fastest capable core as the BSP at an early power-up time. In addition, for maximum power saving, the logic selects the most power efficient core as the BSP. Processor or switching for selecting the BSP happens during the boot-up as well as power-up flows (e.g., S3, S4, and/or S5 flows).

In some embodiments, the memories herein are organized in multi-level memory architecture and their performance is governed by a decentralized scheme. The decentralized scheme includes p-unit 5510 and memory controllers. In some embodiments, the scheme dynamically balances a number of parameters such as power, thermals, cost, latency and performance for memory levels that are progressively further away from the processor in platform 5500 based on how applications are using memory levels that are further away from processor cores. In some examples, the decision making for the state of the far memory (FM) is decentralized. For example, a processor power management unit (p-unit), near memory controller (NMC), and/or far memory host controller (FMHC) makes decisions about the power and/or performance state of the FM at their respective levels. These decisions are coordinated to provide the most optimum power and/or performance state of the FM for a given time. The power and/or performance state of the memories adaptively change to changing workloads and other parameters even when the processor(s) is in a particular power state.

In some embodiments, a hardware and software coordinated processor power state policy (e.g., policy for C-state) is implemented that delivers optimal power state selection by taking in to account the performance and/or responsiveness needs of thread expected to be scheduled on the core entering idle, to achieve improved instructions per cycle (IPC) and performance for cores running user critical tasks. The scheme provides the ability to deliver responsiveness gains for important and/or user-critical threads running on a system-on-chip. P-unit 5510 which coupled to the plurality of processing cores, receives a hint from operating system 5552 indicative of a bias towards a power state or performance state for at least one of the processing cores of the plurality of processing cores based on a priority of a thread in context switch.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "analog signal" is any continuous signal for which the time varying feature (variable) of the signal is a representation of some other time varying quantity, i.e., analogous to another time varying signal.

The term "digital signal" is a physical signal that is a representation of a sequence of discrete values (a quantified discrete-time signal), for example of an arbitrary bit stream, or of a digitized (sampled and analog-to-digital converted) analog signal.

The term "scaling" generally refers to converting a design (schematic and layout) from one process technology to another process technology and may be subsequently being reduced in layout area. In some cases, scaling also refers to upsizing a design from one process technology to another process technology and may be subsequently increasing layout area. The term "scaling" generally also refers to downsizing or upsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

It is pointed out that those elements of the figures having the same reference numbers (or names) as the elements of any other figure can operate or function in any manner similar to that described but are not limited to such.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

Here the term "die" generally refers to a single continuous piece of semiconductor material (e.g. silicon) where transistors or other components making up a processor core may reside. Multi-core processors may have two or more processors on a single die, but alternatively, the two or more processors may be provided on two or more respective dies. Each die has a dedicated power controller or power control unit (p-unit) power controller or power control unit (p-unit) which can be dynamically or statically configured as a supervisor or supervisee. In some examples, dies are of the same size and functionality i.e., symmetric cores. However, dies can also be asymmetric. For example, some dies have different size and/or function than other dies. Each processor may also be a dielet or chiplet.

Here the term "dielet" or "chiplet" generally refers to a physically distinct semiconductor die, typically connected to an adjacent die in a way that allows the fabric across a die boundary to function like a single fabric rather than as two distinct fabrics. Thus at least some dies may be dielets. Each dielet may include one or more p-units which can be dynamically or statically configured as a supervisor, supervisee or both.

Here the term "fabric" generally refers to communication mechanism having a known set of sources, destinations, routing rules, topology and other properties. The sources and destinations may be any type of data handling functional unit such as power management units. Fabrics can be two-dimensional spanning along an x-y plane of a die and/or three-dimensional (3D) spanning along an x-y-z plane of a stack of vertical and horizontally positioned dies. A single fabric may span multiple dies. A fabric can take any topology such as mesh topology, star topology, daisy chain topology. A fabric may be part of a network-on-chip (NoC) with multiple agents. These agents can be any functional unit.

Here, the term "processor core" generally refers to an independent execution unit that can run one program thread at a time in parallel with other cores. A processor core may include a dedicated power controller or power control unit (p-unit) which can be dynamically or statically configured as a supervisor or supervisee. This dedicated p-unit is also referred to as an autonomous p-unit, in some examples. In some examples, all processor cores are of the same size and functionality i.e., symmetric cores. However, processor cores can also be asymmetric. For example, some processor cores have different size and/or function than other processor cores. A processor core can be a virtual processor core or a physical processor core.

Here, the term "interconnect" refers to a communication link, or channel, between two or more points or nodes. It may comprise one or more separate conduction paths such as wires, vias, waveguides, passive components, and/or active components. It may also comprise a fabric. In some embodiments, a p-unit is coupled to an OS via an interface.

Here the term "interface" generally refers to software and/or hardware used to communicate with an interconnect. An interface may include logic and I/O driver/receiver to send and receive data over the interconnect or one or more wires.

Here the term "domain" generally refers to a logical or physical perimeter that has similar properties (e.g., supply voltage, operating frequency, type of circuits or logic, and/or workload type) and/or is controlled by a particular agent. For example, a domain may be a group of logic units or function units that are controlled by a particular supervisor. A domain may also be referred to an Autonomous Perimeter (AP). A domain can be an entire system-on-chip (SoC) or part of the SoC, and is governed by a p-unit.

Here the term "supervisor" generally refers to a power controller, or power management, unit (a "p-unit"), which monitors and manages power and performance related parameters for one or more associated power domains, either alone or in cooperation with one or more other p-units. Power/performance related parameters may include but are not limited to domain power, platform power, voltage, voltage domain current, die current, load-line, temperature, device latency, utilization, clock frequency, processing efficiency, current/future workload information, and other parameters. It may determine new power or performance parameters (limits, average operational, etc.) for the one or more domains. These parameters may then be communicated to supervisee p-units, or directly to controlled or monitored entities such as VR or clock throttle control registers, via one or more fabrics and/or interconnects. A supervisor learns of the workload (present and future) of one or more dies, power measurements of the one or more dies, and other parameters (e.g., platform level power boundaries) and determines new power limits for the one or more dies. These power limits are then communicated by supervisor p-units to the supervisee p-units via one or more fabrics and/or interconnect. In examples where a die has one p-unit, a supervisor (Svor) p-unit is also referred to as supervisor die.

Here the term "supervisee" generally refers to a power controller, or power management, unit (a "p-unit"), which monitors and manages power and performance related parameters for one or more associated power domains, either alone or in cooperation with one or more other p-units and receives instructions from a supervisor to set power and/or performance parameters (e.g., supply voltage, operating frequency, maximum current, throttling threshold, etc.) for its associated power domain. In examples where a die has one p-unit, a supervisee (Svee) p-unit may also be referred to as a supervisee die. Note that a p-unit may serve either as a Svor, a Svee, or both a Svor/Svee p-unit.

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Here, multiple non-silicon semiconductor material layers may be stacked within a single fin structure. The multiple non-silicon semiconductor material layers may include one or more "P-type" layers that are suitable (e.g., offer higher hole mobility than silicon) for P-type transistors. The multiple non-silicon semiconductor material layers may further include one or more "N-type" layers that are suitable (e.g., offer higher electron mobility than silicon) for N-type transistors. The multiple non-silicon semiconductor material layers may further include one or more intervening layers separating the N-type from the P-type layers. The intervening layers may be at least partially sacrificial, for example to allow one or more of a gate, source, or drain to wrap completely around a channel region of one or more of the N-type and P-type transistors. The multiple non-silicon semiconductor material layers may be fabricated, at least in part, with self-aligned techniques such that a stacked CMOS device may include both a high-mobility N-type and P-type transistor with a footprint of a single finFET.

Here, the term "backend" generally refers to a section of a die which is opposite of a "frontend" and where an IC (integrated circuit) package couples to IC die bumps. For example, high level metal layers (e.g., metal layer 6 and above in a ten-metal stack die) and corresponding vias that are closer to a die package are considered part of the backend of the die. Conversely, the term "frontend" generally refers to a section of the die that includes the active region (e.g., where transistors are fabricated) and low-level metal layers and corresponding vias that are closer to the active region (e.g., metal layer 5 and below in the ten-metal stack die example).

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process. The examples can be combined in any combinations. For example, example 4 can be combined with example 2.

Example 1: An apparatus comprising: a plurality of power gates coupled to an input power supply rail and an output power supply rail; a shifter to generate a control word to control the plurality of power gates; and a controller to instruct the shifter when to shift up a value of the control word, shift down the value of the control word, or maintain the value of the control word, wherein the controller is to shift up or shift in non-monotonic manner to reduce error between a reference beat frequency and a beat frequency of a free-running oscillator.

Example 2: The apparatus of example 1, wherein the controller is to operate in retention mode or wakeup mode.

Example 3: The apparatus of example 2, wherein, in the retention mode, the controller is to instruct the shifter to shift up the value of the control word when a voltage on the output power supply rail is less than a retention voltage and when the voltage on the output power supply rail has a negative slope or substantially zero slope.

Example 4: The apparatus of example 2, wherein, in the retention mode, the controller is to instruct the shifter to shift down the value of the control word when a voltage on the output power supply rail is greater than a retention voltage and when the voltage on the output power supply rail has a positive slope or when the voltage on the output power supply rail has a substantially zero slope.

Example 5: The apparatus of example 2, wherein, in the wakeup mode, the controller is to instruct the shifter to shift up the value of the control word if a slope of a voltage on the output power supply rail is less than or equal than a reference slope.

Example 6: The apparatus of example 2, wherein, in the wakeup mode, the controller is to instruct the shifter to maintain the value of the control word if a slope of a voltage on the output power supply rail is greater than a reference slope.

Example 7: The apparatus of example 1, wherein the free-running oscillator is to generate a first clock, wherein the apparatus comprises a clock synchronizer to synchronize the first clock with a second clock.

Example 8: The apparatus of example 7, wherein the controller comprises a counter, wherein the clock synchronizer is to generate a third clock, and wherein the counter is to determine the frequency of the first clock via the third clock.

Example 9: The apparatus of example 8, wherein the counter is to receive the second clock.

Example 10: The apparatus of example 8, wherein the controller comprises a first comparator to compare an output of the counter with a digital value indicating a past frequency count of the first clock, and wherein the first comparator is to generate an output indicative of a direction in change in frequency of the first clock relative the past frequency count.

Example 11: The apparatus of example 10, wherein the controller comprises a second comparator to compare the output of the counter with a reference frequency count, wherein the second comparator is to generate an output indicating an error between the first clock relative to the reference frequency count.

Example 12: The apparatus of example 11 comprises a logic to generate the control word according to the outputs of the first and second comparators.

Example 13: The apparatus of example 1, wherein the plurality of power gates comprises p-type devices.

Example 14: An apparatus comprising: a plurality of power gates coupled to an input power supply rail and an output power supply rail; a shifter to generate a control word to control the plurality of power gates; and a controller to instruct the shifter when to shift up a value of the control word, shift down the value of the control word, or maintain the value of the control word, wherein the controller is to shift the value of the control word such that the control word with small change in the value is modified faster than the control word with larger change in the value.

Example 15: The apparatus of example 14, wherein the controller controls a retention minimum operating voltage on the output power supply rail during a low power state.

Example 16: The apparatus of example 15, wherein the controller restores a nominal operating voltage on the output supply rail from the retention operating voltage.

Example 17: A system comprising: a memory; a processor coupled to the memory; and a wireless interface communicatively coupled to the processor, wherein the processor includes a low dropout regulator comprising: a plurality of power gates coupled to an input power supply rail and an output power supply rail; a shifter to generate a control word to control the plurality of power gates; and a controller to instruct the shifter when to shift up a value of the control word, shift down the value of the control word, or maintain the value of the control word, wherein the controller is to shift up or shift in non-monotonic manner to reduce error between a reference beat frequency and a beat frequency of a free-running oscillator.

Example 18: The system of example 17, wherein the controller is to operate in retention mode or wakeup mode.

Example 19: The system of example 18, wherein, in the retention mode, the controller is to instruct the shifter to shift up the value of the control word when a voltage on the output power supply rail is less than a retention voltage and when the voltage on the output power supply rail has a negative slope or substantially zero slope.

Example 20: The system of example 18, wherein, in the retention mode, the controller is to instruct the shifter to shift down the value of the control word when a voltage on the output power supply rail is greater than a retention voltage and when the voltage on the output power supply rail has a positive slope or when the voltage on the output power supply rail has a substantially zero slope.

Example 21: The system of example 18, wherein, in the wakeup mode, the controller is to instruct the shifter to shift up the value of the control word if a slope of a voltage on the output power supply rail is less than or equal than a reference slope.

Example 22: The system of example 18, wherein, in the wakeup mode, the controller is to instruct the shifter to maintain the value of the control word if a slope of a voltage on the output power supply rail is greater than a reference slope.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus comprising:
a plurality of power gates coupled to an input power supply rail and an output power supply rail;
a shifter to generate a control word to control the plurality of power gates; and
a controller to instruct the shifter when to shift up a value of the control word, shift down the value of the control word, or maintain the value of the control word, wherein the controller is to shift up or shift in non-monotonic manner to reduce error between a reference beat frequency and a beat frequency of a free-running oscillator.

2. The apparatus of claim 1, wherein the controller is to operate in retention mode or wakeup mode.

3. The apparatus of claim 2, wherein, in the retention mode, the controller is to instruct the shifter to shift up the value of the control word when a voltage on the output power supply rail is less than a retention voltage and when the voltage on the output power supply rail has a negative slope or substantially zero slope.

4. The apparatus of claim 2, wherein, in the retention mode, the controller is to instruct the shifter to shift down the value of the control word when a voltage on the output power supply rail is greater than a retention voltage and when the voltage on the output power supply rail has a positive slope or when the voltage on the output power supply rail has a substantially zero slope.

5. The apparatus of claim 2, wherein, in the wakeup mode, the controller is to instruct the shifter to shift up the value of the control word if a slope of a voltage on the output power supply rail is less than or equal than a reference slope.

6. The apparatus of claim 2, wherein, in the wakeup mode, the controller is to instruct the shifter to maintain the value of the control word if a slope of a voltage on the output power supply rail is greater than a reference slope.

7. The apparatus of claim 1, wherein the free-running oscillator is to generate a first clock, wherein the apparatus comprises a clock synchronizer to synchronize the first clock with a second clock.

8. The apparatus of claim 7, wherein the controller comprises a counter, wherein the clock synchronizer is to generate a third clock, and wherein the counter is to determine the frequency of the first clock via the third clock.

9. The apparatus of claim 8, wherein the counter is to receive the second clock.

10. The apparatus of claim 8, wherein the controller comprises a first comparator to compare an output of the counter with a digital value indicating a past frequency count of the first clock, and wherein the first comparator is to generate an output indicative of a direction in change in frequency of the first clock relative the past frequency count.

11. The apparatus of claim 10, wherein the controller comprises a second comparator to compare the output of the counter with a reference frequency count, wherein the second comparator is to generate an output indicating an error between the first clock relative to the reference frequency count.

12. The apparatus of claim 11 comprises a logic to generate the control word according to the outputs of the first and second comparators.

13. The apparatus of claim 1, wherein the plurality of power gates comprises p-type devices.

14. A system comprising:
a memory;
a processor coupled to the memory; and
a wireless interface communicatively coupled to the processor, wherein the processor includes a low dropout regulator comprising:
a plurality of power gates coupled to an input power supply rail and an output power supply rail;
a shifter to generate a control word to control the plurality of power gates; and
a controller to instruct the shifter when to shift up a value of the control word, shift down the value of the control word, or maintain the value of the control word, wherein the controller is to shift up or shift in non-monotonic manner to reduce error between a reference beat frequency and a beat frequency of a free-running oscillator.

15. The system of claim 14, wherein the controller is to operate in retention mode or wakeup mode.

16. The system of claim 15, wherein, in the retention mode, the controller is to instruct the shifter to shift up the value of the control word when a voltage on the output power supply rail is less than a retention voltage and when the voltage on the output power supply rail has a negative slope or substantially zero slope.

17. The system of claim 15, wherein, in the retention mode, the controller is to instruct the shifter to shift down the value of the control word when a voltage on the output power supply rail is greater than a retention voltage and when the voltage on the output power supply rail has a positive slope or when the voltage on the output power supply rail has a substantially zero slope.

18. The system of claim 15, wherein, in the wakeup mode, the controller is to instruct the shifter to shift up the value of the control word if a slope of a voltage on the output power supply rail is less than or equal than a reference slope.

19. The system of claim 15, wherein, in the wakeup mode, the controller is to instruct the shifter to maintain the value of the control word if a slope of a voltage on the output power supply rail is greater than a reference slope.

\* \* \* \* \*